United States Patent
Tong et al.

(10) Patent No.: US 11,889,725 B2
(45) Date of Patent: Jan. 30, 2024

(54) FLEXIBLE DISPLAY PANEL AND MANUFACTURING METHOD THEREOF, AND FLEXIBLE DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Kemeng Tong, Beijing (CN); Xiangdan Dong, Beijing (CN); Fan He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 637 days.

(21) Appl. No.: 17/042,386

(22) PCT Filed: Dec. 20, 2019

(86) PCT No.: PCT/CN2019/126927
§ 371 (c)(1),
(2) Date: Sep. 28, 2020

(87) PCT Pub. No.: WO2021/120164
PCT Pub. Date: Jun. 24, 2021

(65) Prior Publication Data
US 2023/0024214 A1 Jan. 26, 2023

(51) Int. Cl.
*H10K 59/131* (2023.01)
*H10K 59/40* (2023.01)
(Continued)

(52) U.S. Cl.
CPC ......... *H10K 59/131* (2023.02); *H10K 59/122* (2023.02); *H10K 59/40* (2023.02);
(Continued)

(58) Field of Classification Search
CPC .... H10K 59/131; H10K 59/122; H10K 59/40; H10K 71/00; H10K 77/111;
(Continued)

(56) References Cited

U.S. PATENT DOCUMENTS

2017/0170206 A1 6/2017 Lee et al.
2018/0090696 A1 3/2018 Jang et al.
(Continued)

FOREIGN PATENT DOCUMENTS

CN 106887447 A 6/2017
CN 108962026 A 12/2018
(Continued)

OTHER PUBLICATIONS

Extended European Search Report from European Patent Application No. 19945465.3 dated Nov. 21, 2022.

*Primary Examiner* — Kyoung Lee
(74) *Attorney, Agent, or Firm* — Dilworth & Barrese, LLP.; Michael J. Musella, Esq.

(57) ABSTRACT

A flexible display panel and a manufacturing method thereof, and a flexible display apparatus are disclosed. The flexible display panel includes: a flexible substrate, the flexible substrate including a display area, a peripheral area, a welding area and a bending area, and the bending area including a first edge; and the flexible display panel further includes: a barrier and an organic insulation layer, wherein the peripheral area includes a peripheral transition area between the bending area and the display area, the organic insulation layer in the peripheral transition area is provided with a first groove, the first groove is on one side of the
(Continued)

barrier and extends along a direction substantially parallel to a bending axis, and the first groove is on one side of the first edge proximal to the display area.

21 Claims, 15 Drawing Sheets

(51) Int. Cl.
- *H10K 59/122* (2023.01)
- *H10K 71/00* (2023.01)
- *H10K 77/10* (2023.01)
- *H10K 59/12* (2023.01)
- *H10K 102/00* (2023.01)

(52) U.S. Cl.
CPC ........... *H10K 71/00* (2023.02); *H10K 77/111* (2023.02); *H10K 59/1201* (2023.02); *H10K 2102/311* (2023.02)

(58) Field of Classification Search
CPC ......... H10K 59/1201; H10K 2102/311; H10K 50/844; H10K 59/124; H10K 59/123; H10K 59/1213; Y02E 10/549
See application file for complete search history.

(56) References Cited

U.S. PATENT DOCUMENTS

| | | |
|---|---|---|
| 2018/0108722 A1 | 4/2018 | Nishikawa |
| 2019/0319201 A1* | 10/2019 | Goh .................... H10K 77/111 |
| 2019/0372034 A1 | 12/2019 | Kaneko et al. |

FOREIGN PATENT DOCUMENTS

| | | |
|---|---|---|
| CN | 109148532 A | 1/2019 |
| EP | 3236309 A1 | 10/2017 |
| EP | 3742268 A1 | 11/2020 |

* cited by examiner

C-C

FLEXIBLE DISPLAY PANEL AND MANUFACTURING METHOD THEREOF, AND FLEXIBLE DISPLAY APPARATUS

TECHNICAL FIELD

Embodiments of the present disclosure relate to a flexible display panel and a manufacturing method thereof, and a flexible display apparatus.

BACKGROUND

With development of an Active Matrix Organic Light-Emitting Diode (AMOLED) display technology, a frame of a flexible AMOLED product is gradually narrowed, a screen-to-body ratio of the flexible AMOLED product is gradually increased, and a thickness of the product is also gradually reduced. In order to meet demands of users for the thickness of the product and touch experience, how to reduce the thickness of the product and implement better touch experience becomes a research hotspot in the industry.

SUMMARY

Embodiments of the present disclosure provide a flexible display panel and a manufacturing method thereof, and a flexible display apparatus.

According to first aspect of the present disclosure, a flexible display panel, comprising:

a flexible substrate, the flexible substrate comprising: a display area; a peripheral area, surrounding a periphery of the display area; a welding area, on one side of the peripheral area distal to the display area; and a bending area, between the peripheral area and the welding area, the bending area being configured to be bent along a bending axis, the bending area comprising a first edge;

the flexible substrate further comprising:

a barrier, on the flexible substrate, the barrier being in the peripheral area and surrounding the periphery of the display area; and an organic insulation layer, on the flexible substrate, wherein the peripheral area comprises a peripheral transition area between the bending area and the display area, the organic insulation layer in the peripheral transition area is provided with a first groove, the first groove is on one side of the barrier distal to the display area and extends along a direction substantially parallel to the bending axis, and the first groove is on one side of the first edge proximal to the display area.

In at least some embodiments, the peripheral transition area comprises a first fanout area, and an orthographic projection of the first groove on the flexible substrate partially overlaps with the first fanout area.

In at least some embodiments, the flexible substrate further comprises: a second fanout area, between the bending area and the welding area, the second fanout area abutting on the bending area, wherein the organic insulation layer between the bending area and the welding area is provided with a second groove, and an orthographic projection of the second groove on the flexible substrate partially overlaps with the second fanout area.

In at least some embodiments, the bending area further comprises a second edge, the second edge is disposed opposite to the first edge, extending directions of the second edge and the first edge are same, and the second groove is on one side of the second edge proximal to the welding area and extends along a direction substantially parallel to the bending axis.

In at least some embodiments, the organic insulation layer in the bending area is provided with a third groove and a fourth groove, the third groove and the fourth groove extend along a direction perpendicular to the bending axis.

In at least some embodiments, each of the third groove and the fourth groove comprises a first end and a second end, the third groove and the fourth groove extend across the bending area, the first end of the third groove and the first end of the fourth groove are respectively connected with two opposite ends of the first groove, and the second end of the third groove and the second end of the fourth groove are respectively connected with two opposite ends of the second groove.

In at least some embodiments, the flexible display panel further comprises: a signal line, on the flexible substrate, the signal line being led out the display area and at least partially extending to the welding area through the first fanout area and the bending area along the direction perpendicular to the bending axis, wherein no overlapping area is formed between the orthographic projection of each of the first groove, the second groove, the third groove and the fourth groove on the flexible substrate and an orthographic projection of the signal line on the flexible substrate, and wherein each of the first groove and the second groove is disconnected at a position intersecting with the signal line, the first groove has a first spacing at the intersecting position, the second groove has a second spacing at the intersecting position, and the signal line extends to pass through the first spacing and the second spacing.

In at least some embodiments, the signal line comprises a plurality of signal lines, and each of the third groove and the fourth groove is between one of the plurality of signal lines, which is farthest distal to the second fanout area, and an edge of the flexible substrate.

In at least some embodiments, the flexible display panel further comprises: a touch electrode, in the display area and configured to detect occurrence of a touch in the display area; the signal line comprising: a touch signal line, configured to be electrically connected with the touch electrode in the display area, wherein the touch signal line comprises a first touch portion in the bending area and a second touch portion outside the bending area, and the first touch portion of the touch signal line and the second touch portion of the touch signal line are in different film layers.

In at least some embodiments, the display area comprises a plurality of pixel areas, each of the plurality of the pixel areas is provided with an organic light-emitting element, and the signal line further comprises: a common signal line, configured to be electrically connected with the organic light-emitting element, wherein the common signal line comprises a first common portion in the bending area and a second common portion outside the bending area, the first common portion of the common signal line and the second common portion of the common signal line are in different film layers; and wherein no overlapping area is formed between an orthographic projection of the first common portion of the common signal line on the flexible substrate and an orthographic projection of the first touch portion of the touch signal line on the flexible substrate, and an overlapping area is formed between an orthographic projection of the second common portion of the common signal line on the flexible substrate and an orthographic projection of the second touch portion of the touch signal line on the flexible substrate.

In at least some embodiments, each of the plurality of the pixel areas is further provided with a pixel circuit, and the signal line further comprises: a driving signal line, on one side of the common signal line distal to the second fanout area, the driving signal line being configured to be electrically connected with the pixel circuit, wherein the driving signal line comprises a first driving portion in the bending area and a second driving portion outside the bending area, and the first driving portion of the driving signal line and the second driving portion of the driving signal line are in different film layers.

In at least some embodiments, the flexible display further comprises: a first gate electrode layer, on the flexible substrate; a first gate insulation layer, on one side of the first gate electrode layer distal to the flexible substrate; and a second gate electrode layer, on one side of the first gate insulation layer distal to the flexible substrate, wherein the first groove is on one side of the second gate electrode layer distal to the flexible substrate.

In at least some embodiments, the organic insulation layer comprises: a first planarization layer, one side of the second gate electrode layer distal to the flexible substrate; and a second planarization layer, on one side of the first planarization layer distal to the flexible substrate, wherein the first groove penetrates the first planarization layer and the second planarization layer, the first groove comprises a side wall, and the side wall is a side wall of the second planarization layer encasing the first planarization layer.

In at least some embodiments, the first groove is formed through a patterning process performed on the second planarization layer by using a dual-tone mask, and an included angle between a tangent line of the side wall and the flexible substrate is approximately from 20 degrees to 40 degrees.

In at least some embodiments, the side wall has an arc-shaped slope surface, the arc-shaped slope surface is connected with a top surface of the second planarization layer at the peripheral edge of the first groove, and the arc-shaped slope surface is tangent to the top surface at their connection position.

In at least some embodiments, the side wall comprises a plurality of side portions in a plane perpendicular to an extending direction of the first groove, each of the plurality of the side portions has an arc-shaped slope surface, and a plurality of the arc-shaped slope surfaces are connected with each other to form the side wall.

In at least some embodiments, the flexible display panel further comprises: a second gate insulation layer, on the second gate electrode layer; a first source-drain electrically-conductive layer, between the second gate insulation layer and the first planarization layer; a second source-drain electrically-conductive layer, between the first planarization layer and the second planarization layer; a first touch electrically-conductive layer, on one side of the second planarization layer distal to the flexible substrate; a second touch electrically-conductive layer, on one side of the first touch electrically-conductive layer distal to the flexible substrate; and a touch insulation layer, between the first touch electrically-conductive layer and the second touch electrically-conductive layer, wherein the first portion of the touch signal line comprises the second source-drain electrically-conductive layer, and the second portion of the touch signal line comprises the first touch electrically-conductive layer and the second touch electrically-conductive layer.

In at least some embodiments, the second touch electrically-conductive layer in the second portion of the touch signal line is in lapped connection with the second source-drain electrically-conductive layer in the first portion of the touch signal line through an opening in the second planarization layer.

In at least some embodiments, the first common portion of the common signal line comprises the second source-drain electrically-conductive layer, and the second common portion of the common signal line comprises the first source-drain electrically-conductive layer.

In at least some embodiments, the first driving portion of the driving signal line comprises the second source-drain electrically-conductive layer, and the second driving portion of the driving signal line comprises the first source-drain electrically-conductive layer.

In at least some embodiments, the flexible display panel further comprises: an encapsulation layer, between the second planarization layer and the first touch electrically-conductive layer; and a pixel definition layer, configured to define a plurality of pixel areas, the pixel definition layer being between the second planarization layer and the encapsulation layer; the barrier comprising: a first barrier, in the peripheral area and surrounding the display area, wherein the first barrier comprises a first barrier portion in the peripheral transition area and a second barrier portion in other areas of the peripheral area except the peripheral transition area; and a second barrier, in the peripheral area and surrounding the display area, wherein the second barrier is on one side of the first barrier distal to the display area, and the second barrier comprises a third barrier portion in the peripheral transition area and a fourth barrier portion in other areas of the peripheral area except the peripheral transition area, wherein the first barrier portion comprises the second planarization layer and the pixel definition layer, and the third barrier portion comprises the first planarization layer, the second planarization layer encasing the first planarization layer, and the pixel definition layer encasing the second planarization layer.

In at least some embodiments, the second planarization layer in the first barrier portion and the second planarization layer in the third barrier portion are formed through the patterning process by using the dual-tone mask.

In at least some embodiments, the flexible display panel further comprises: a spacer layer, between the pixel definition layer and the encapsulation layer, wherein the second barrier portion comprises the second planarization layer, the pixel definition layer, and the spacer layer, and the fourth barrier portion comprises the first planarization layer, the second planarization layer encasing the first planarization layer, the pixel definition layer encasing the second planarization layer, and the spacer layer.

In at least some embodiments, the peripheral transition area comprises a first fanout area, the orthographic projection of the first groove on the flexible substrate partially overlaps with the first fanout area, and the flexible substrate further comprises: a second fanout area, between the bending area and the welding area and abutting on the bending area; the flexible display panel further comprising: a data connection line, the data connection line extending from the display area and passing through the first fanout area, the bending area, and the second fanout area to reach the welding area, wherein a portion of the data connection line respectively in the first fanout area and the second fanout area is formed by the first gate electrode layer and the second gate electrode layer which are alternately arranged.

In at least some embodiments, the flexible substrate further comprises: a detection area, a controlling circuit area, a third fanout area, and an integrated circuit area, all of which are sequentially arranged between the second fanout area and the welding area.

According to second aspect of the present disclosure, it is provided a flexible display panel, comprising:

a flexible substrate, the flexible substrate comprising: a display area; a peripheral area, surrounding a periphery of the display area; a welding area, on one side of the peripheral area distal to the display area; a bending area, between the peripheral area and the welding area; and a fanout area, between the bending area and the welding area, the fanout area abutting on the bending area;

the flexible substrate further comprising:

an organic insulation layer, on the flexible substrate, wherein the organic insulation layer between the bending area and the welding area is provided with a groove, and an orthographic projection of the groove on the flexible substrate partially overlaps with the fanout area.

According to third aspect of the present disclosure, it is provided a flexible display panel, comprising:

a flexible substrate, the flexible substrate comprising: a display area; a peripheral area, surrounding a periphery of the display area; a welding area, on one side of the peripheral area distal to the display area; and a bending area, between the peripheral area and the welding area, the bending area being configured to be bent along a bending axis;

the flexible substrate further comprising:

an organic insulation layer, on the flexible substrate, wherein the organic insulation layer in the bending area is provided with at least one groove, and the at least one groove extends along a direction perpendicular to the bending axis.

According to fourth aspect of the present disclosure, it is provided a flexible display apparatus, comprising the aforementioned flexible display panel.

According to fifth aspect of the present disclosure, it is provided a method for manufacturing a flexible display panel, comprising:

providing a flexible substrate, the flexible substrate comprising: a display area; a peripheral area, surrounding a periphery of the display area; a welding area, on one side of the peripheral area distal to the display area; and a bending area, between the peripheral area and the welding area, the bending area being configured to be bent along a bending axis, the bending area comprising a first edge, wherein the peripheral area comprises a peripheral transition area between the bending area and the welding area;

the method further comprising:

forming a barrier on the flexible substrate, the barrier being in the peripheral area and surrounding the periphery of the display area;

forming an organic insulation layer on the flexible substrate; and forming a first groove in the organic insulation layer in the peripheral transition area, the first groove being on one side of the barrier distal to the display area and extending along a direction parallel to the bending axis, and the first groove being on one side of the first edge proximal to the display area, wherein the first groove is formed through a patterning process performed on the organic insulation layer by using a dual-tone mask.

In at least some embodiments, the forming the organic insulation layer on the flexible substrate comprises: forming a first planarization thin film on the flexible substrate; patterning the first planarization thin film to form a first planarization layer; forming a second planarization thin film on one side of the first planarization layer distal to the flexible substrate, the second planarization thin film overlaying the first planarization layer; and patterning the second planarization thin film by using the dual-tone mask to form a second planarization layer having the first groove, wherein the first groove is formed through the patterning process performed on the second planarization thin film in the peripheral area by using the dual-tone mask, and the first groove penetrates the first planarization layer and the second planarization layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
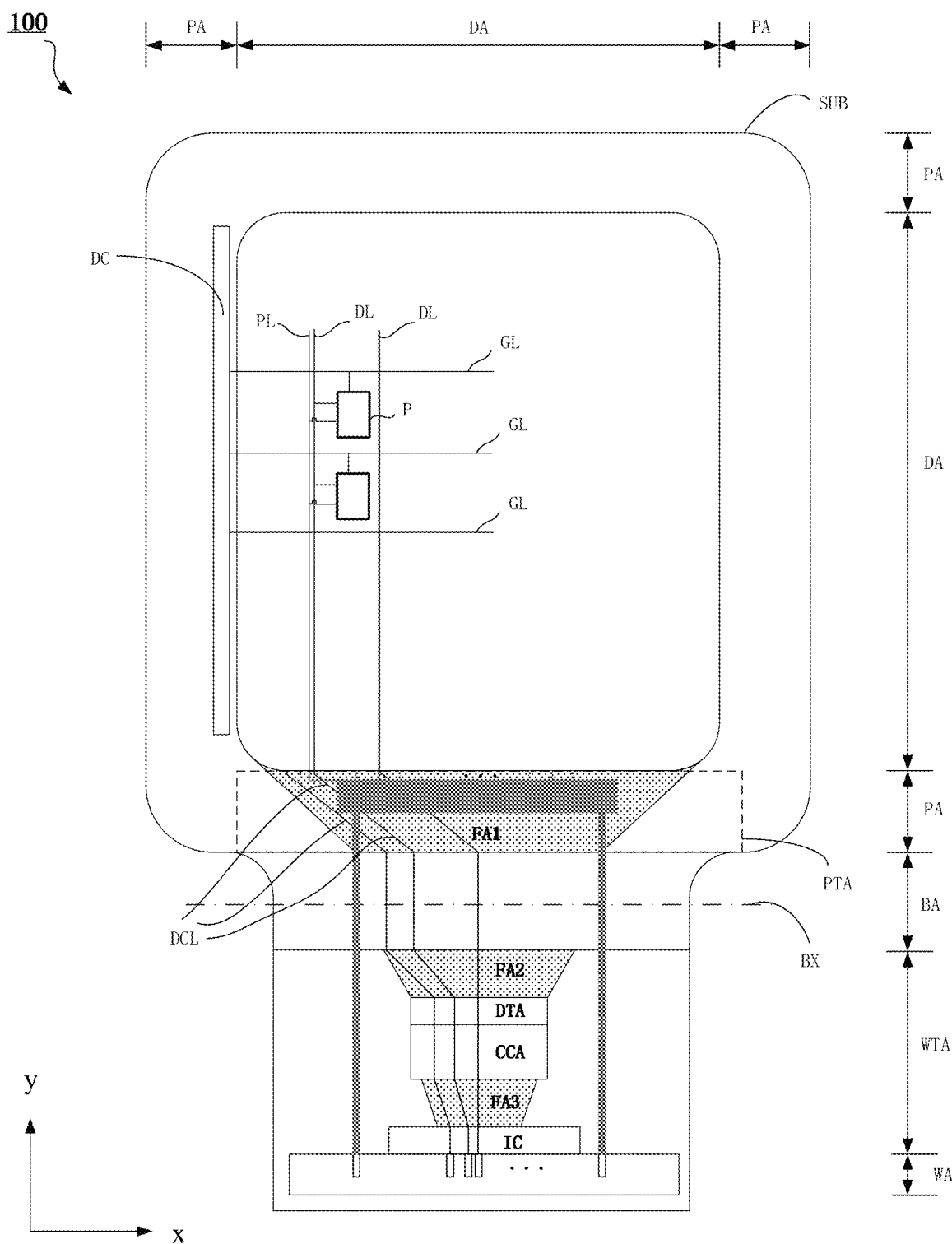
FIG. 1 is a planar schematic diagram of a flexible display panel according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the description below, in a case that an element or layer is referred to "be" "on" another element or layer or "be connected to" another element or layer, the element or layer may be directly on the another element or layer or directly connected to the another element or layer, or there may be an intermediate element or intermediate layer. However, in a case that an element or layer is referred to "be directly" "on" another element or layer or "be directly connected to" another element or layer, there is no intermediate element or intermediate layer. The term "and/or" includes random and all combinations of one or more related listed items.

Terms such as "first", "second" and the like can be used for describing various elements, components, areas, layers, and/or portions herein, but these elements, components, areas, layers, and/or portions should not be limited by these terms. These terms are used for distinguishing one element, component, area, layer and/or portion from another element, component, area, layer and/or portion. Therefore, without departure from the instruction of the present disclosure, the first element, the first component, the first area, the first layer and/or the first portion discussed below may be referred to as the second element, the second component, the second area, the second layer and/or the second portion.

For the description objective, spatial relative terms such as "under", "below", "lower", "above", "upper" and the like may be used herein so as to describe a relationship between one element or feature and another (other) element or feature as illustrated in the drawings. Besides directions described in the drawings, the spatial relative terms intend to include different directions of a device when used, operated and/or manufactured. For example, if the device in the drawings is turned over, the element described to "be" "below" or "under" other elements or features then will be located to "be" "above" the other elements or features. Therefore, the exemplary term "below" may include two directions of above and below.

Currently, a back plane (BP) in an AMOLED flexible display apparatus is liable to generate cracks due to multiple film layers, small thickness and the like; especially in a bending area, it is more liable to cause fracture of a metal routing.

An embodiment of the present disclosure provides a flexible display panel, including a flexible substrate, the flexible substrate including: a display area; a peripheral area surrounding a periphery of the display area; a welding area on one side of the peripheral area distal to the display area; and a bending area between the peripheral area and the welding area, the bending area being configured to be bent along a bending axis, the bending area including a first edge. The flexible display panel further includes: a barrier on the flexible substrate, the barrier being in the peripheral area and surrounding the periphery of the display area; and an organic insulation layer on the flexible substrate. The peripheral area includes a peripheral transition area between the bending area and the display area, the organic insulation layer in the peripheral transition area is provided with a first groove, the first groove is on one side of the barrier distal to the display area and extends along a direction substantially parallel to the bending axis, and the first groove is on one side of the first edge proximal to the display area.

In the flexible display panel, the first groove is disposed in the organic insulation layer and within the peripheral transition area, the first groove is on one side of the barrier distal to the display area and extends along the direction substantially parallel to the bending axis, and particularly, the first groove is on one side of the first edge of the bending area proximal to the display area. Therefore, it is easier to release a bending stress and prevent fracture occurring in the bending area.

Figure 2:
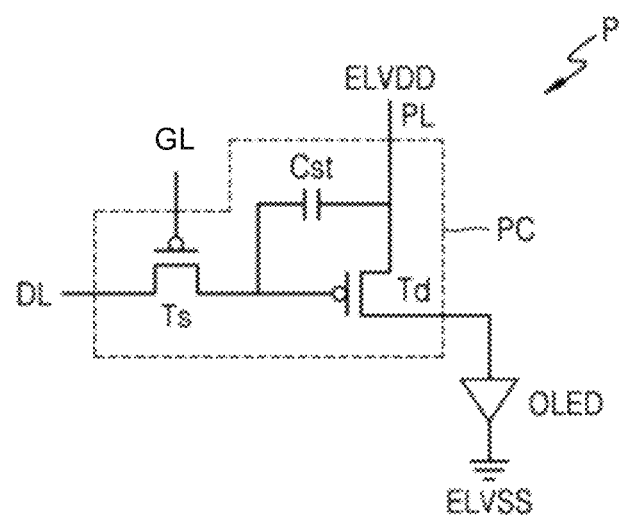
FIG. 2 is an equivalent circuit diagram of a pixel circuit of a flexible display panel according to an embodiment of the present disclosure.
Figure 3:
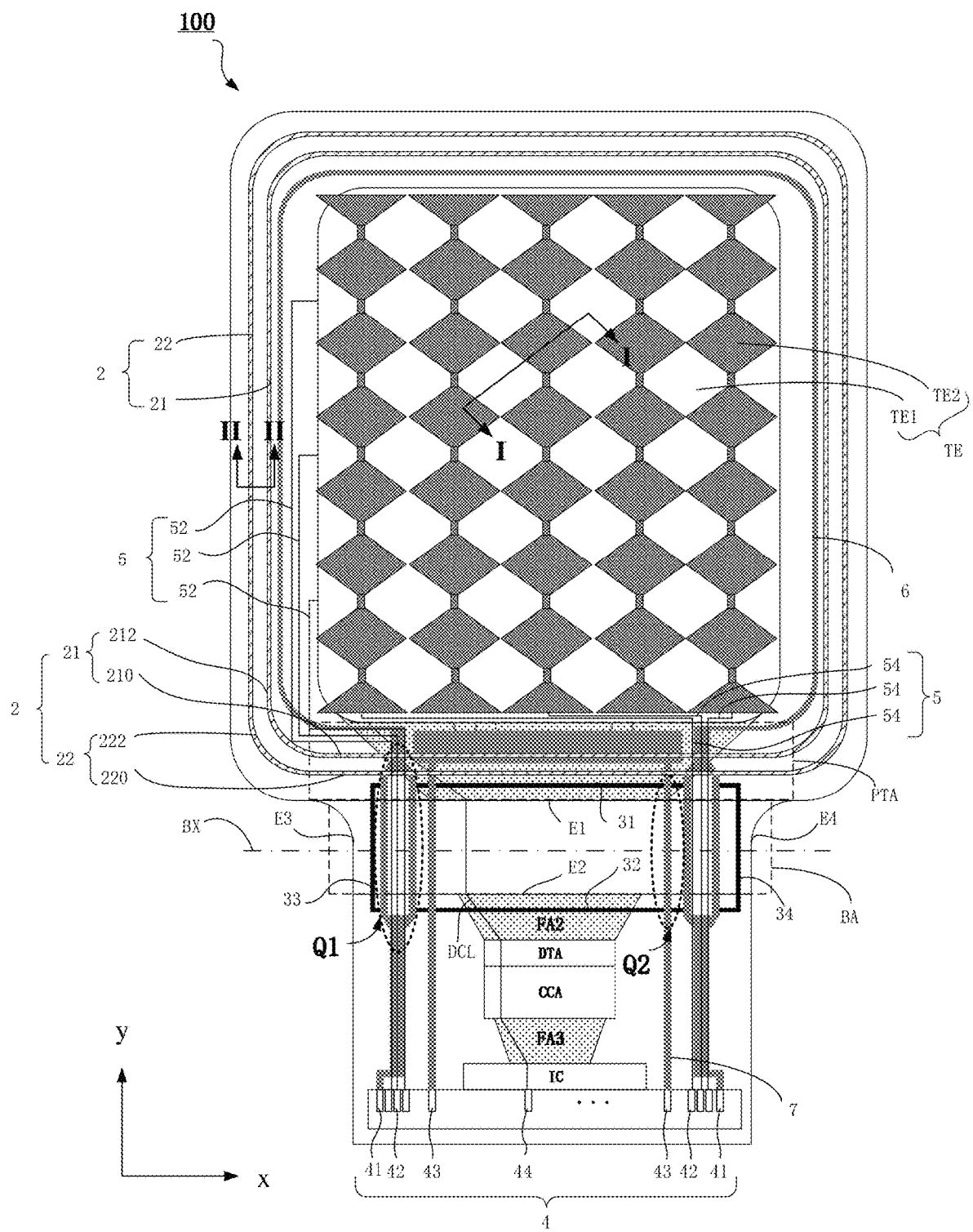
FIG. 3 is another planar schematic diagram of the flexible display panel in FIG. 1.

FIG. 1 is a planar schematic diagram of a flexible display panel according to an embodiment of the present disclosure. FIG. 2 is an equivalent circuit diagram of a pixel circuit of a flexible display panel according to an embodiment of the present disclosure. FIG. 3 is another planar schematic diagram of the flexible display panel in FIG. 1.

As illustrated in FIG. 1, a flexible display panel 100 provided by the embodiment of the present disclosure includes a flexible substrate SUB, and the flexible substrate SUB includes a display area DA and a peripheral area PA. For example, the flexible substrate SUB is provided with a plurality of gate lines GL extending along an x direction and a plurality of data lines DL extending along a y direction. The plurality of gate lines GL are electrically connected to a driving circuit DC in the peripheral area PA. The plurality of gate lines GL and the plurality of data lines DL intersect to define a plurality of pixel areas. A pixel P is arranged in each of the pixel areas, and each pixel P is provided with an organic light-emitting element, e.g., an organic light-emitting Diode OLED. Because light emitted by the organic light-emitting diode may be used for displaying an image, an area where the plurality of pixels P are located is defined as the display area DA. The peripheral area PA is arranged outside the display area DA. For example, the peripheral area PA surrounds a periphery of the display area DA, and the peripheral area PA cannot display the image and is a non-display area.

As illustrated in FIG. 2, each of the pixels P includes a pixel circuit PC connected to the gate line GL and the data line DL of the pixel P and the organic light-emitting diode OLED connected to the pixel circuit PC. The pixel circuit PC includes a driving Thin-Film Transistor (TFT) Td, a switching TFT Ts and a storage capacitor Cst. The switching TFT Ts is connected to the gate line DL and the data line DL, and is configured to transmit a data signal received by the data line DL to the driving TFT Td according to a scanning signal received by the gate line GL. The storage capacitor Cst is connected to the switching TFT Ts and a driving voltage line PL, and is configured to store a voltage difference between a voltage received from the switching TFT Ts and a driving voltage ELVDD supplied to the driving voltage line PL. The driving TFT Td is connected to the driving voltage line PL and the storage capacitor Cst, and is configured for controlling a driving current flowing from the driving voltage line PL to the organic light-emitting diode OLED according to a voltage value stored in the storage capacitor Cst. The organic light-emitting diode OLED emits light with expected brightness by using the driving current. The organic light-emitting diode OLED may emit, for example, red light, green light, blue light, or white light. FIG. 2 illustrates a case in which the pixel P includes two TFTs and one storage capacitor Cst, the exemplary embodiments of the present disclosure may adopt different modes of transistors and storages. In other embodiments, the pixel circuit PC of the pixel P may include three or more TFTs, or include two or more storage capacitors.

As illustrated in FIG. 1, the flexible substrate SUB further includes a welding area WA, and the welding area WA is located on one side of the peripheral area PA which is distal to the display area DA. For example, as illustrated in FIG. 3, the welding area WA is located on one of sides of the display area DA. The welding area WA includes a plurality of contact pads (or pads) 4, and each contact pad 4 is configured to be electrically connected with a signal line extending out of the display area DA or the peripheral area PA. The contact pad 4 may be exposed on the surface of the welding area WA, i.e., be not covered by any layer, so as to facilitate being electrically connected to a flexible print circuit board FPCB. The flexible print circuit board FPCB is electrically connected with an external controller, and is configured to transmit a signal or power from the external controller. For example, a contact pad 41 is electrically connected with a common signal line 6, a contact pad 42 is electrically connected with a touch signal line 5, a contact pad 43 is electrically connected with a driving signal line 7, and a contact pad 44 is electrically connected with a data connection line DCL (the data connection line DCL is electrically connected with the data line DL in the display area DA). The contact pad 4 is electrically connected with each signal line, so that mutual communication between the signal line and the flexible print circuit board FPCB can be implemented. The number and the arranging mode of the contact pads 4 are not specifically limited herein, and may be arranged according to actual demands.

Figure 4:
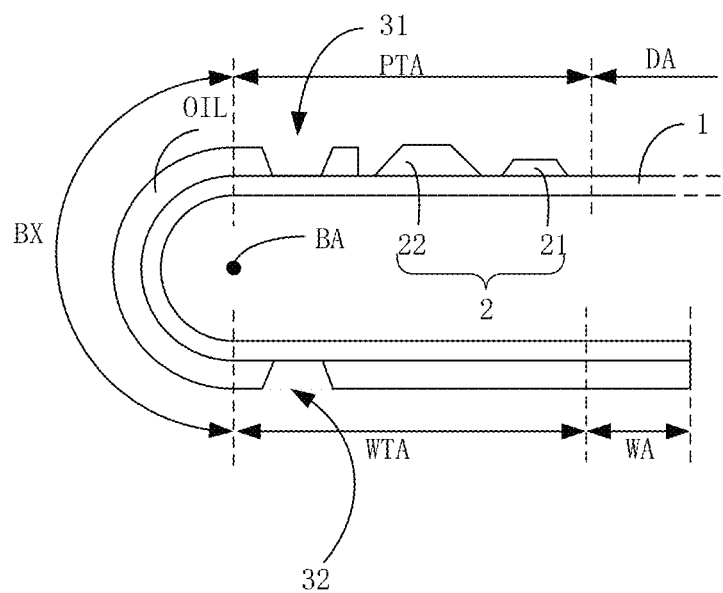
FIG. 4 is a partially structural schematic diagram of a flexible display panel in a bent state according to an embodiment of the present disclosure.
Figure 8:
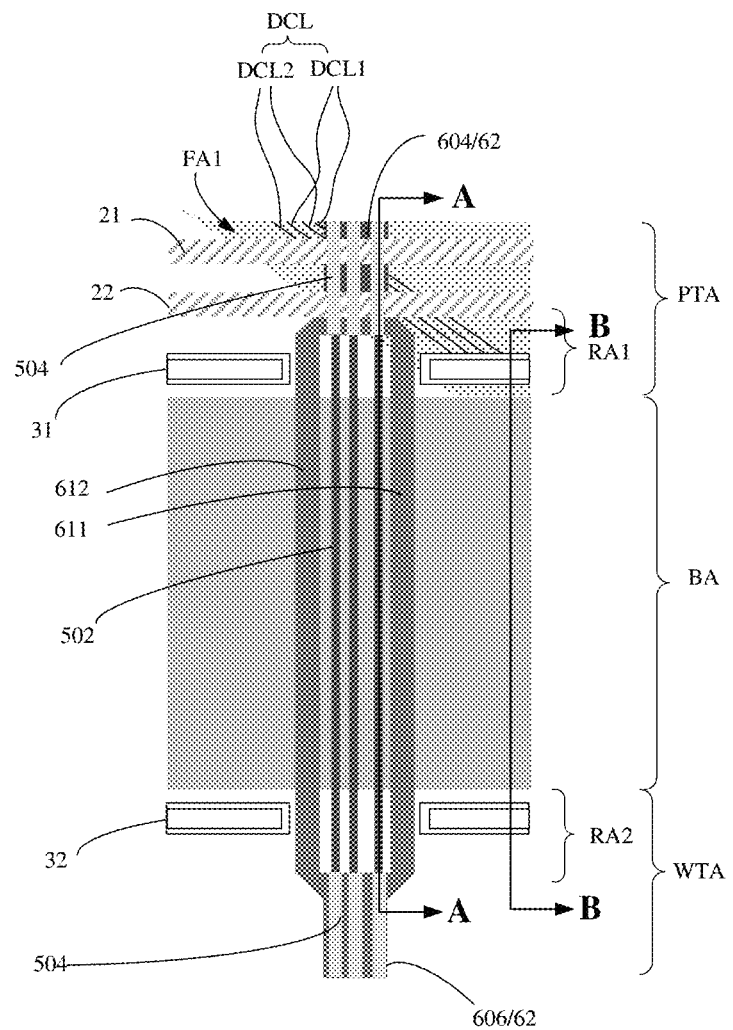
FIG. 8 is an enlarged planar schematic diagram of an area Q1 of the flexible display panel in FIG. 3.

As illustrated in FIG. 1, the flexible substrate SUB further includes a bending area BA, which is located between the peripheral area PA and the welding area WA. The bending area BA is adjacent to the peripheral area PA and the bending area BA is configured to be bent along a bending axis BX. In order to facilitate description, the present disclosure defines an area between the bending area BA and the welding area WA as a welding transition area WTA, and defines a portion of the peripheral area PA between the bending area BA and the display area DA as a peripheral transition area PTA, as illustrated in FIG. 1 and FIG. 3. Further, the peripheral transition area PTA may include a first layer-change area RA1 proximal to one side of the bending area BA, and the first layer-change area RA1 is configured for changing the layer of the signal line from the peripheral transition area PTA to the bending area BA. Further, the welding transition area WTA may include a second layer-change area RA2 proximal to the bending area BA, and the second layer-change area RA2 is configured for changing the layer of the signal line from the bending area BA to the welding transition area WTA, as illustrated in FIG. 8. In a situation where the flexible substrate SUB is bent around the bending axis BX, each position of the bending area BA of the flexible substrate SUB is in a bent state, i.e., a curvature of each position is not equal to zero. FIG. 4 is a partially structural schematic diagram of the flexible display panel 100 in the bent state according to an embodiment of the present disclosure. As illustrated in FIG. 4, the bending area BA is bent along the bending axis BX, each position of the bending area BA is in the bent state, i.e., the curvature is not equal to zero, but other areas of the flexible substrate SUB, including the display area DA, the peripheral area PA, the welding transition area WTA, the welding area WA and the like, all are not in the bent state. Bending of the bending area BA enables both the welding transition area WTA and the welding area WA on one side of the bending area BA distal to the display area DA, to be located on the rear side (generally, a display side of the flexible display panel is regarded as the front side by default, and one side opposite to the display side is regarded as the rear side or the back side) of the flexible display panel 100, so that a space utilization ratio can be increased, and an area occupied by the non-display area can be reduced.

As illustrated in FIG. 3 and FIG. 4, the flexible display panel 100 further includes a barrier 2, which is arranged on the flexible substrate SUB. The barrier 2 is located in the peripheral area PA and surrounds the periphery of the display area DA. In at least one example, the barrier 2 has a dam structure, and the dam structure can block external water vapor or oxygen from entering the display area DA so as to avoid influence on a display effect. For example, there may be one or more barriers 2. Further, in a situation where there are a plurality of barriers 2, the blocking ability can be reinforced. For example, as illustrated in FIG. 3, the barrier 2 includes a first barrier 21 and a second barrier 22, and the second barrier 22 is located on one side of the first barrier 21 distal to the display area DA, so that the external water vapor or oxygen can be further prevented from entering the display area DA, thereby providing double protection for the display area DA. In at least one example, a height of the first barrier 21 with respect to the flexible substrate SUB is smaller than a height of the second barrier 22 with respect to the flexible substrate SUB. Therefore, a path for the external water vapor and oxygen to enter the display area DA is lengthened, so that the difficulty of the external water vapor and oxygen in entering the display area DA is increased, thereby further improving the blocking ability of the barrier.

As illustrated in FIG. 4, the flexible display panel 100 further includes an organic insulation layer OIL arranged on the flexible substrate SUB. For the purpose of schematic illustration, the flexible display panel 100 in FIG. 4 illustrates only the flexible substrate SUB and the organic insulation layer OIL thereon, other layers on the flexible substrate SUB are omitted. In at least some embodiments, at least one groove is disposed in the organic insulation layer OIL of the peripheral transition area PTA, so that the risk of fracture of the bending area BA can be reduced. For example, as illustrated in FIG. 3, a first groove 31 is disposed in the organic insulation layer OIL of the peripheral transition area PTA. An extending direction of the first groove 31 may be parallel to the bending axis BX, or may also be not parallel to the bending axis BX. In a situation where the extending direction of the first groove 31 is parallel to the bending axis BX, each position of the first groove 31 can more uniformly disperse a bending stress so as to prevent partial fracture of the bending area BA, which is thus preferred. For example, as illustrated in FIG. 3 and FIG. 4, the first groove 31 is located on one side of the barrier 2 distal to the display area DA, and substantially extends along the direction parallel to the bending axis BX. Further, in at least one example, an included angle between the extending direction of the first groove 31 and an extending direction of the bending axis BX is from 175 degrees to 185 degrees. For example, the peripheral transition area PTA includes a first layer-change area located on one side proximal to the bending area, and the first layer-change area is configured for change the layer of the signal line, as illustrated in FIG. 8.

For example, as illustrated in FIG. 3, the bending area BA includes a first edge E1, and the first edge E1 extends along a direction substantially parallel to the bending axis BX. The first groove 31 is located on one side of the first edge E1 proximal to the display area DA and is adjacent to the bending area BA. In a situation where the bending area BA is in the bent state, stress concentration may be formed on the surface of the bending area BA, and the first groove 31 is adjacent to the first edge E1 of the bending area BA, and thus, it is easier to disperse the stress generated by the bending area BA as soon as possible so as to rapidly reduce the risk of fracture of the bending area BA. In the embodiment of the present disclosure, the first groove 31 is not located in the bending area BA, and thus, the influence on a layer structure in the bending area BA can be avoided while the first groove 31 is formed, so as to facilitate manufacturing of the first groove 31.

In at least some embodiments, the peripheral transition area PTA includes a first fanout area FA1, and one portion of the first groove 31 is located in the first fanout area FA1. For example, as illustrated in FIG. 1 and FIG. 3, the first fanout area FA1 respectively abuts on the display area DA and the bending area BA, the term "abut" used in the present disclosure means adjacent or directly connected with each other, i.e., the first fanout area FA1 is adjacent to and directly connected with the display area DA, and the first fanout area FA1 is further adjacent to and directly connected with the bending area BA. A plurality of signal lines led out of the display area DA extend towards the welding area WA after being aggregated by the first fanout area FA1. For example, as illustrated in FIG. 3, an orthographic projection of the first groove 31 on the flexible substrate SUB partially overlaps with the first fanout area FA1, i.e., an orthographic projection of at least one portion of the first groove 31 on the flexible substrate SUB is located in the first fanout area FA1. In a case that the signal line led out of the display area DA intersects with the first groove 31 and is located on the first groove 31 (i.e., on one side of the first groove 31 distal to the flexible substrate SUB), it can be avoided that the signal line is fractured due to bending of the bending area BA, thereby improving safety of the signal line and ensuring stability of a signal.

In at least some embodiments, at least one groove is further disposed in the organic insulation layer OIL between the bending area BA and the welding area WA, so that the risk of fracture of the bending area BA can be reduced. For example, as illustrated in FIG. 3, a second groove 32 is further disposed in the organic insulation layer OIL of the welding transition area WTA. An extending direction of the second groove 32 may be parallel to the bending axis BX, or may also be not parallel to the bending axis BX. In a situation where the extending direction of the second groove 32 is parallel to the bending axis BX, each position of the second groove 32 can more uniformly disperse the bending stress so as to prevent partial fracture, and thus, it is preferred to set the extending direction of the second groove 32 to be parallel to the bending axis BX. For example, as illustrated in FIG. 3 and FIG. 4, the second groove 32 extends along the direction substantially parallel to the bending axis BX and is next to the bending area BA. Further, in at least one example, an included angle between the extending direction of the second groove 32 and the extending direction of the bending axis BX is from 175 degrees to 185 degrees.

For example, as illustrated in FIG. 3, the bending area BA further includes a second edge E2 disposed opposite to the first edge E1, extending directions of the second edge E2 and the first edge E1 are the same, and the second edge E2 also extends along the direction substantially parallel to the bending axis BX. For example, the second groove 32 is located on one side of the second edge E2 distal to the display area DA, and is adjacent to the bending area BA. In a situation where the bending area BA is in the bent state, stress concentration may be formed on the surface of the bending area BA, and the second groove 32 is adjacent to the second edge E2 of the bending area BA, and thus, it is easier to disperse the stress generated by the bending area BA as soon as possible so as to rapidly reduce the risk of fracture of the bending area BA. In the embodiment of the present disclosure, the second groove 32 is not located in the bending area BA, and thus, influence on the layer structure in the bending area BA can be avoided while the second groove 32 is formed, so as to facilitate manufacturing of the second groove 32.

In at least some embodiments, the welding transition area WTA includes a second fanout area FA2, and one portion of the second groove 32 is located in the second fanout area FA2. For example, as illustrated in FIG. 1 and FIG. 3, the flexible substrate SUB further includes the second fanout area FA2, the second fanout area FA2 is located in the welding transition area WTA and abuts on the bending area BA, i.e., the second fanout area FA2 and the bending area BA are adjacent and directly connected with each other, and there is no other area between the second fanout area FA2 and the bending area BA. For example, as illustrated in FIG. 3, an orthographic projection of the second groove 32 on the flexible substrate SUB partially overlaps with the second fanout area FA2, i.e., an orthographic projection of at least one portion of the second groove 32 on the flexible substrate SUB is located in the second fanout area FA2. In a case that the signal line led out of the bending area BA intersects with the second groove 32 and is located on the second groove 32 (i.e., on one side of the second groove 32 distal to the flexible substrate SUB), it can be avoided that the signal line is fractured due to bending of the bending area BA, thereby improving safety of the signal line and ensuring stability of the signal. In the embodiment of the present disclosure, widths of the first groove 31 and the second groove 32 in a direction perpendicular to the bending axis BX may be equal to each other or different from each other. In a situation where the widths of the first groove 31 and the second groove 32 in the direction perpendicular to the bending axis BX are equal to each other, complexity of process manufacturing can be reduced.

In at least some embodiments, the organic insulation layer OIL in the bending area BA is further provided with at least one groove. Further, in at least one example, at least one groove extending along the direction substantially perpendicular to the bending axis BX is disposed in the organic insulation layer OIL within the bending area BA. In a situation where the bending area BA is bent, a tension (i.e., the bending stress) in each direction may be generated on the surface of the bending area BA, and thus, the grooves arranged in the direction perpendicular to the bending axis BX can facilitate dispersing the bending stress in the longitudinal direction of the bending area BA. As illustrated in FIG. 3, the organic insulation layer OIL in the bending area BA is further provided with a third groove 33, and the third groove 33 extends along the direction substantially perpendicular to the bending axis BX. For example, the bending area BA further includes a third edge E3, and the third groove 33 is adjacent to the third edge E3. Further, in at least one example, the organic insulation layer OIL in the bending area BA is further provided with a fourth groove 34, and the fourth groove 34 extends along the direction substantially perpendicular to the bending axis BX, as illustrated in FIG. 3. The bending area BA further includes a fourth edge E3, and the fourth groove 34 is adjacent to the fourth edge E3. Widths of the third groove 33 and the fourth groove 34 in the direction perpendicular to the bending axis BX may be equal to each other or different from each other. In a situation where the widths of the third groove 33 and the fourth groove 34 in the direction parallel to the bending axis BX are equal to each other, complexity of process manufacturing can be reduced.

Figure 5:
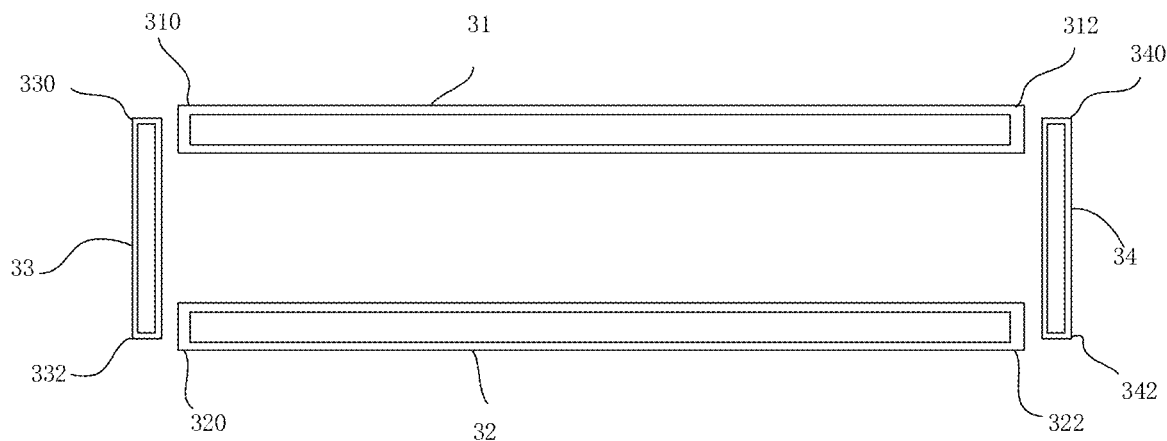
FIG. 5 is a planar schematic diagram of a plurality of grooves in a flexible display panel according to an embodiment of the present disclosure.

In the embodiments of the present disclosure, any two adjacent grooves among the first groove 31, the second groove 32, the third groove 33 and the fourth groove 34 may not communicate with each other, or may communicate with each other. The term "communicate" denotes that two adjacent grooves are directly connected with each other and penetrate through each other. FIG. 5 is a planar schematic diagram of a plurality of grooves in a flexible display panel according to an embodiment of the present disclosure. As illustrated in FIG. 5, the first groove 31 includes a first end 310 and a second end 312, the second groove 32 includes a first end 320 and a second 322, the third groove 33 includes a first end 330 and a second 332, and the fourth groove 34 includes a first end 340 and a second 342. For example, four grooves are in a state that they are spaced apart from one another, i.e., any two adjacent grooves do not communicate with one another. In a situation where four grooves in FIG. 5 are in a state that they communicate with one another, a closed-loop groove structure is formed. Therefore, the bending stress can be transferred and dispersed in a plurality of grooves so as to further avoid fracture of the bending area BA. In one example, as illustrated in FIG. 3, the third groove 33 and the fourth groove 34 extend across the bending area BA along the direction perpendicular to the bending axis BX, the first end 330 of the third groove 33 and the first end 340 of the fourth groove 34 are respectively connected with two opposite ends 310 and 312 of the first groove 31, while the second end 332 of the third groove 33 and the second end 334 of the fourth groove 34 are respectively connected with two opposite ends 320 and 324 of the second groove 32. By enabling four grooves to communicate with one another, the concentrated stress can be transferred among the grooves so as to further reduce the risk of fracture of the bending area BA.

Figure 6:
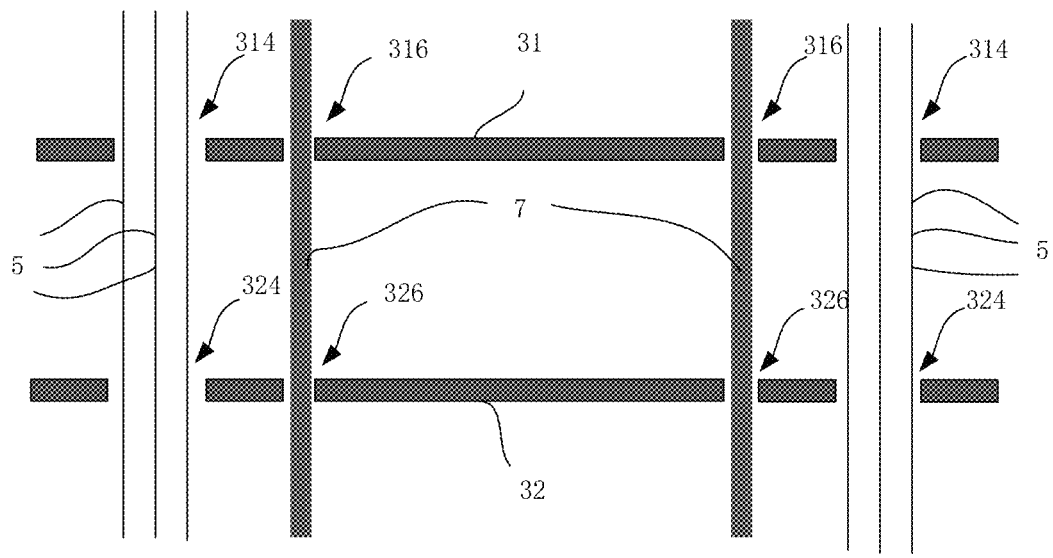
FIG. 6 is a planar schematic diagram of a first groove and a second groove in a flexible display panel according to an embodiment of the present disclosure.

As illustrated in FIG. 3, a plurality of signal lines, such as the touch signal line 5, the common signal line 6, the driving signal line 7, and the data connection line DCL, are arranged on the flexible substrate SUB. These signal lines are led out of the display area DA and at least partially extend to the welding area WA through the first fanout area FA1 and the bending area BA along the direction perpendicular to the bending axis BX. In at least some embodiments, no overlapping area is formed between the orthographic projection of each of the first groove 31, the second groove 32, the third groove 33, and the fourth groove 34 on the flexible substrate SUB and an orthographic projection of each of the signal lines on the flexible substrate SUB, so that influence of the grooves on a wiring layout of the existing signal line can be avoided. For example, in the embodiments of the present disclosure, as illustrated in FIG. 6, the first groove 31 is disconnected at positions where it intersects with the touch signal line 5, the common signal line 6, or the driving signal line 7; and similarly, the second groove 32 is disconnected at positions where it intersects with the touch signal line 5, the common signal line 6, or the driving signal line 7.

In at least some embodiments, the first groove 31 and the second groove 32 have certain spacings at the positions where they intersect with the signal lines. FIG. 6 is a planar schematic diagram of the first groove and the second groove in a flexible display panel according to an embodiment of the present disclosure. As illustrated in FIG. 6, for example, the first groove 31 has a spacing 314 at the position where it intersects with the touch signal line 5, and the first groove 31 has a spacing 316 at the position where it intersects with the driving signal line 7. The second groove 32 has a spacing 324 at the position where it intersects with the touch signal line 5, and the second groove 32 has a spacing 326 at the position where it intersects with the driving signal line 7. Therefore, the touch signal line 5 led out of the display area DA first passes through the spacing 314 of the first groove 31, and then passes through the spacing 324 of the second groove 32. By design the spacings 314 and 316 respectively in the first groove 31 and the second groove 32, influence of two grooves on wiring layout of the existing touch signal line 5 can be avoided, and particularly, influence of two grooves on the layer-level changing of the touch signal line 5 is avoided. For example, a plurality of touch signal lines 5 are provided, and a plurality of spacings are provided in one-to-one correspondence with a plurality of touch signal lines 5. For another example, as illustrated in FIG. 6, one spacing 314 is provided for accommodating a plurality of touch signal lines 5. In order to simplify a production process, the setting of one spacing capable of accommodating a plurality of signal lines is a preferred embodiment. In this embodiment, in order to avoid signal interference, the driving signal line 7 and the touch signal line 5 are spaced from each other. Thus, the driving signal line 7 first passes through the spacing 316 of the first groove 31 and then passes through the spacing 326 of the second groove 32. By disposing the spacings 316 and 326 in the first groove 31 and the second groove 32, influence of two grooves on wiring layout of the existing driving signal line 7 can be avoided, and particularly, influence on the layer-level changing of the driving signal line 7 is avoided.

For the common signal line 6, for example, the first groove 31 and the second groove 32 each is provided with a spacing for accommodating the common signal line 6; for another example, the common signal line 6 is in the same spacing as the touch signal line 5. In this embodiment, in order to make layout more reasonable and make a space occupancy rate higher, both the common signal line 6 and the touch signal line 5 are arranged in the spacings 314 and 316; as illustrated in FIG. 6, the common signal line 6 first passes through the spacing 314 of the first groove 31 and then passes through the spacing 324 of the second groove 32. It should be understood that in a case that a design of the first groove 31 and the second groove 32 does not influence the wiring layout of the existing signal line, a gap or spacing may also be not reserved for the signal line. For example, as illustrated in FIG. 5, there is no spacing reserved for the signal line in both the first groove 31 and the second groove 32, but the stress generated due to bending can also be dispersed.

In at least some embodiments, for example, as illustrated in FIG. 3, no overlapping area is formed between an orthographic projection of each of the touch signal line 5, the common signal line 6, and the driving signal line 7 on the flexible substrate SUB and the orthographic projection of the third groove 33 on the flexible substrate SUB; no overlapping area is formed between the orthographic projection of each of the touch signal line 5, the common signal line 6, and the driving signal line 7 on the flexible substrate SUB and the orthographic projection of the fourth groove 34 on the flexible substrate SUB. Further, each of the third groove 33 and the fourth groove 34 is located between one of the plurality of signal lines, which is farthest distal to the second fanout area FA2, and an edge of the flexible substrate SUB. For example, as illustrated in FIG. 3, the data connection line DCL passes through the second fanout area FA2, but the touch signal line 5, the common signal line 6 and the driving signal line 7 all do not pass through the second fanout area FA2, moreover, the signal line which is farthest distal to the second fanout area FA2 is the common signal line 6. Each of the third groove 33 and the fourth groove 34 is located between the edge of the flexible substrate SUB and the common signal line 6.

In at least some embodiments, the flexible display panel 100 further includes a touch sensitive structure. According to a working principle, the touch sensitive structure may be divided into a resistive type, a capacitive type, an infrared type and the like. In those touch sensitive structures, the capacitive touch sensitive structure has the advantages of high sensitivity, long service life, high light transmittance and the like. Generally, the capacitive touch sensitive structure may be a mutual-capacitive touch sensitive structure, or may be a self-capacitive touch sensitive structure. In a situation where the capacitive touch sensitive structure is the mutual-capacitive touch sensitive structure, a capacitive touch electrode includes a touch driving electrode and a touch sensing electrode. In a situation where the capacitive touch sensitive structure is a self-capacitive touch sensitive structure, the capacitive touch electrode merely includes a self-capacitive electrode. The embodiments of the present disclosure are illustrated by taking the mutual-capacitive touch sensitive structure as an example.

For example, as illustrated in FIG. 3, the flexible display panel 100 includes a touch electrode TE and the touch signal line 5, and the touch electrode TE is located in the display area DA and configured to detect occurrence of a touch in the display area DA. For example, the touch electrode TE includes a first touch electrode TE1 and a second touch electrode TE2. A plurality of first touch electrodes TE1 constitute a first touch electrode line extending along the x direction, and a plurality of second touch electrodes TE2 constitute a second touch electrode line extending along the y direction. A plurality of first touch electrode lines and a plurality of second touch electrode lines intersect with each other, and thus, touch capacitors are formed at intersections of the first touch electrode lines and the second touch electrode lines. The touch position is determined by detecting a change of the touch capacitance during the touch act, which is caused by the approach of a finger for example. The flexible display panel 100 further includes a plurality of touch signal lines 5, and each of the touch signal lines 5 is configured to be electrically connected with the touch electrode TE in the display area DA. For example, as illustrated in FIG. 3, the touch signal line 5 includes first touch signal lines 52 and second touch signal lines 54. Each of the first touch signal lines 52 is electrically connected with the first touch electrode line extending along the x direction, and each of the second touch signal lines 54 is electrically connected with the second touch electrode line extending along the y direction. For the purpose of simple illustrating, FIG. 3 only illustrates three first touch signal lines 52 and three second touch signal lines 54. In the exemplary implementation, each of the first touch electrode lines is electrically connected with one of the first touch signal lines 52, and each of the second touch electrode lines is electrically connected with one of the second touch signal lines 54, so that a touch signal generated by each touch electrode TE is transmitted to the welding area WA by the touch signal line 5 and then be electrically connected with an external touch chip by the contact pad 4 of the welding area WA.

Figure 7:
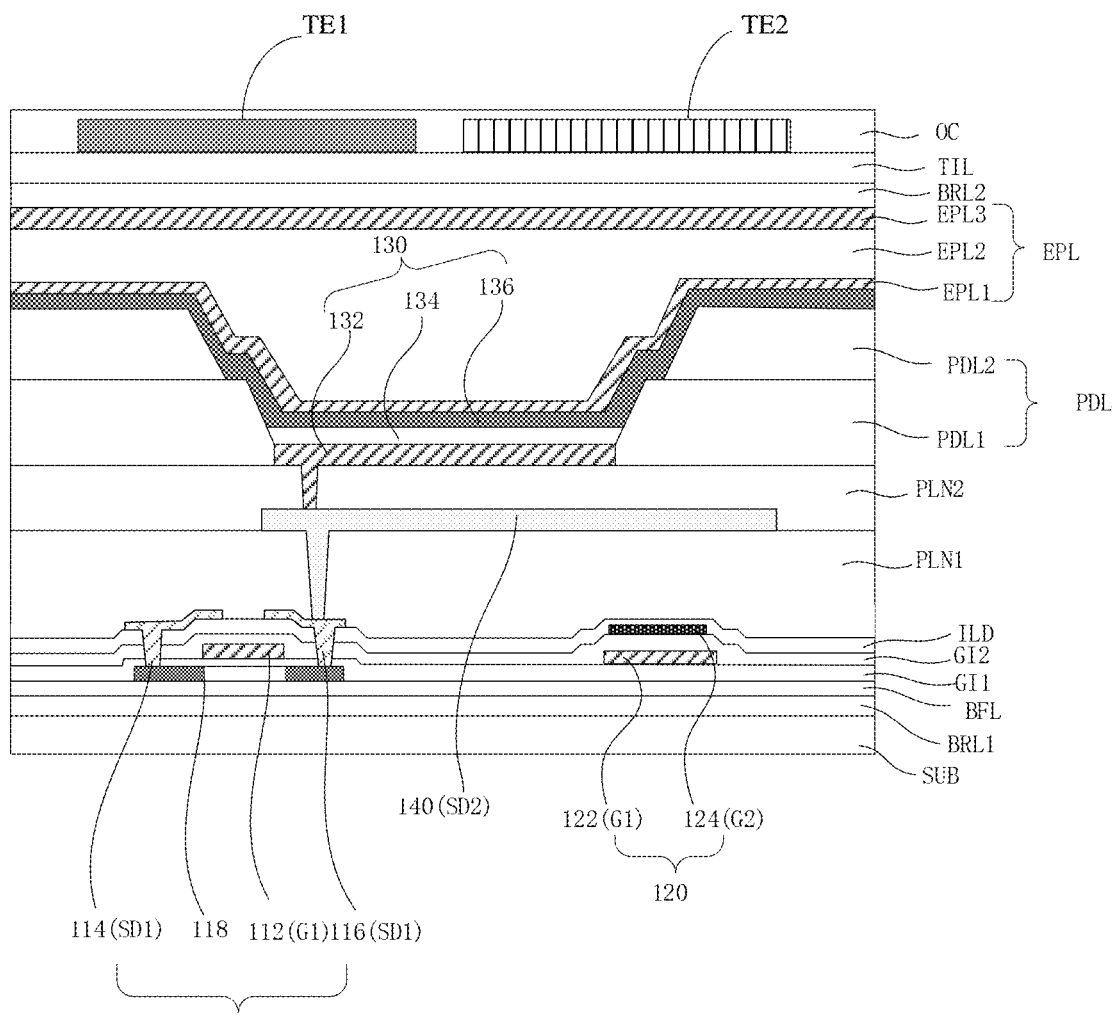
FIG. 7 is a sectional schematic diagram along a line I-I in FIG. 3.
Figure 9:
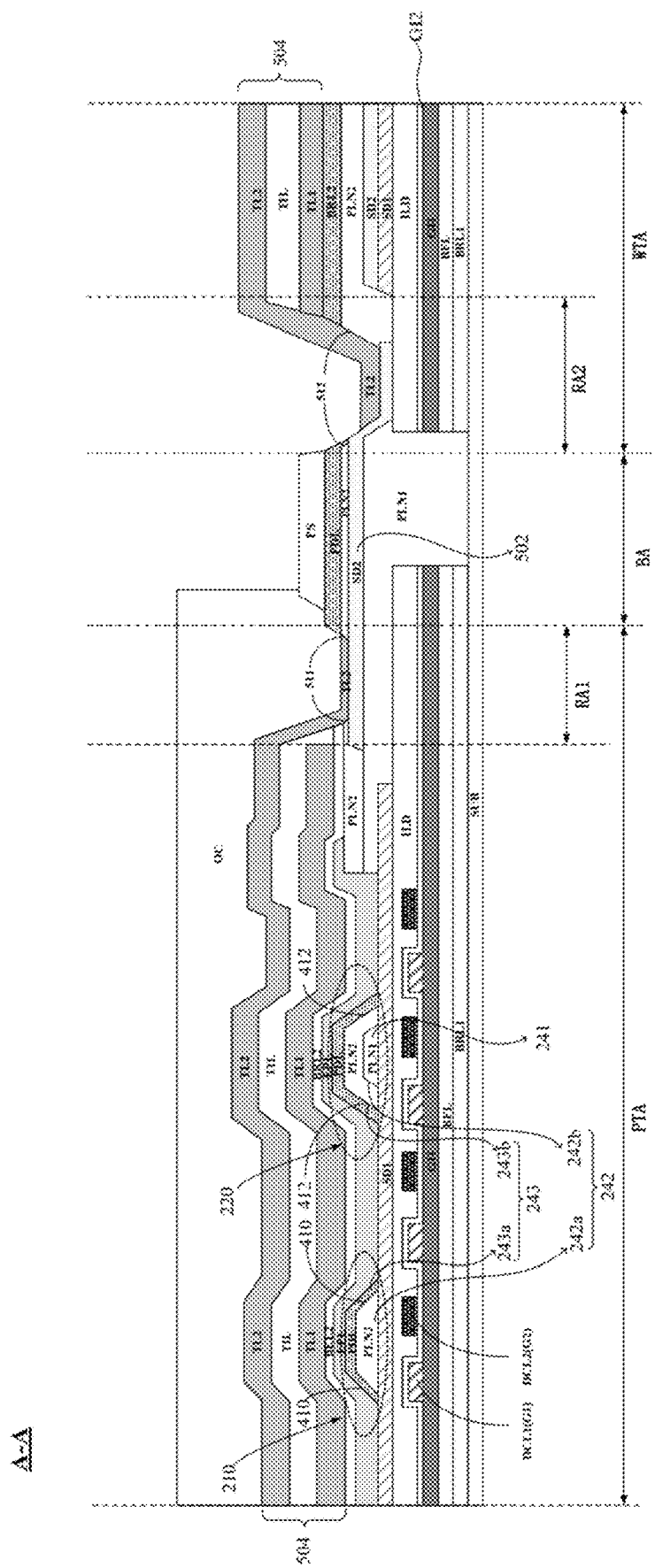
FIG. 9 is a sectional schematic diagram along a line A-A in FIG. 8.

FIG. 7 is a sectional schematic diagram along a line I-I in FIG. 3. FIG. 8 is an enlarged planar schematic diagram of an area Q1 of the flexible display panel in FIG. 3. FIG. 9 is a sectional schematic diagram along a line A-A in FIG. 8.

For example, the flexible substrate SUB may be made of a flexible organic material, and the organic material, for example, is a resin material, such as polyimide, polycarbonate, polyacrylate, polyetherimide, polyether sulfone, polyethylene terephthalate, polyethylene naphthalate and the like.

For example, a first barrier layer BRL1 is arranged on the flexible substrate SUB. The first barrier layer BRL1 may expose an upper surface, which is located in the bending area BA, of a portion of the flexible substrate SUB. The first barrier layer BRL1 is configured to block moisture and/or oxygen from permeating the flexible substrate SUB; the first barrier layer BRL1 may include an inorganic material, such as silicon oxide (SiOx), silicon nitride (SiNx), and/or silicon oxynitride (SiON), and may be formed as multiple layers or a single layer. Moreover, in a situation where the surface of the flexible substrate SUB is relatively uneven, the first barrier layer BRL1 can increase surface flatness of the flexible substrate SUB.

For example, a buffer layer BFL is arranged on the first barrier layer BRL1. the buffer layer BFL may prevent or reduce diffusion of metal atoms and/or impurities from the flexible substrate SUB into a semiconductor layer. In the embodiment of the present disclosure, the buffer layer BFL exposes an upper surface, located in the bending area BA, of a portion of the substrate. For example, the buffer layer BFL may include an inorganic material, such as silicon oxide (SiOx), silicon nitride (SiNx), and/or silicon oxynitride (SiON), and may be formed as multiple layers or a single layer.

For example, an active layer is arranged on the buffer layer BFL. The active layer may include, for example, an inorganic semiconductor material (e.g., polycrystalline silicon, amorphous silicon and the like), an organic semiconductor material, or an oxide semiconductor material. For example, the active layer includes a semiconductor layer 118. The semiconductor layer 118 may include a channel region overlaid with a gate electrode 112, a source region and a drain region. The source region and the drain region are respectively disposed on both sides of the channel region. Both the source region and the drain area may include impurities having higher concentration than impurities in the channel region. The impurities may include N-type impurities or P-type impurities.

For example, a first gate insulation layer GI1 is arranged on the active layer. The first gate insulation layer GI1 may cover the active layer. For example, the first gate insulation layer GI1 sufficiently covers a thickness of the active layer. In the embodiment of the present disclosure, the first gate insulation layer exposes the upper surface, located in the bending area BA, of a portion of the flexible substrate SUB. The first gate insulation layer may include, for example, a silicon compound or a metal oxide. For example, the first gate insulation layer GI1 may include silicon oxynitride (SiON), silicon oxide (SiOx), silicon nitride (SiNx), silicon oxycarbide (SiOxCy), silicon carbide with nitrogen (SiCxNy), aluminium oxide (AlOx), aluminium nitride (AlNx), tantalum oxide (TaOx), hafnium oxide (HfOx), zirconium oxide (ZrOx), titanium oxide (TiOx) and the like. The first gate insulation layer GI1 may be formed as a single layer or multiple layers.

For example, a first gate electrode layer G1 is arranged on the first gate insulation layer GI1. For example, the first gate electrode layer G1 includes a gate electrode in the display area DA, a first storage capacitor electrode plate 122 in the display area DA, and a plurality of first data connection lines DCL1 in the first fanout area FA1. The gate electrode layer may include, for example, metal, metal alloy, metal nitride, electrically-conductive metal oxide, a transparent electrically-conductive material and the like. For example, the gate electrode layer may include gold (Au), alloy of gold, silver (Ag), alloy of silver, aluminium (Al), alloy of aluminium, aluminium nitride (AlNx), tungsten (W), tungsten nitride (WNx), copper (Cu), alloy of copper, nickel (Ni), chromium (Cr), chromium nitride (CrNx), molybdenum (Mo), alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide and the like. There may be a single layer or multiple layers of the gate electrodes. In the embodiment of the present disclosure, the first gate electrode layer G1 includes a plurality of patterns insulated from each other. For example, the gate electrode, the first storage capacitor electrode plate 122, and a plurality of first data connection lines DCL1 are different patterns in the first gate electrode layer G1, they are insulated from one another, and the plurality of first data connection lines DCL1 are also insulated from one another.

For example, a second gate insulation layer GI2 is arranged on the first gate electrode layer G1. The second gate insulation layer GI2 may cover the gate electrode, the first storage capacitor electrode plate 122 and a plurality of first data connection lines DCL1. In the embodiment of the present disclosure, the second gate insulation layer exposes the upper surface, located in the bending area BA, of a portion of the flexible substrate SUB. The second gate insulation layer may include, for example, a silicon compound or metal oxide. For example, the second gate insulation layer GI2 may include silicon oxynitride (SiON), silicon oxide (SiOx), silicon nitride (SiNx), silicon oxycarbide (SiOxCy), silicon carbide with nitrogen (SiCxNy), aluminium oxide (AlOx), aluminium nitride (AlNx), tantalum oxide (TaOx), hafnium oxide (HfOx), zirconium oxide (ZrOx), titanium oxide (TiOx) and the like. The second gate insulation layer GI2 may be formed as a single layer or multiple layers.

For example, a second gate electrode layer G2 is arranged on the second gate insulation layer GI2. The second gate electrode layer G2, for example, includes a second capacitor electrode in the display area DA and a plurality of second data connection lines DCL2 in the peripheral area PA. In the embodiment of the present disclosure, the second gate electrode layer G2 includes a plurality of patterns insulated from one another. For example, the second capacitor electrode and a plurality of data connection lines DCL2 are different patterns in the second gate electrode layer G2, they are insulated from each other, and the plurality of second data connection lines DCL2 are also insulated from one another. It can be seen from FIG. 9 that the first data connection line DCL1 and the second data connection line DCL2 are alternately arranged in the peripheral transition area PTA along a direction parallel to a plane where the flexible substrate SUB is located, so that the space utilization ratio can be increased and a thickness of the film layers in the peripheral area PA can be reduced. In FIG. 7, a storage capacitor 120 includes a first capacitor electrode and a second capacitor electrode. The storage capacitor 120 in FIG. 7 may be the storage capacitor Cst described above with reference to FIG. 2. In another example, as a modification of the storage capacitor illustrated in FIG. 7, the first capacitor electrode of the storage capacitor is arranged in the same layer as the gate electrode, while the second capacitor electrode of the storage capacitor is arranged in the same layer as a source electrode 114 and a drain electrode 116 (i.e., is located in a first source-drain electrically-conductive layer SD1), in this case, a lamination of an interlayer insulation layer ILD and the second gate insulation layer GI2 is sandwiched between the first capacitor electrode and the second capacitor electrode and used as a dielectric material for forming the storage capacitor.

For example, the interlayer insulation layer ILD is arranged on the second gate electrode layer G2. The interlayer insulation layer ILD covers a second storage capacitor electrode plate 124 and a plurality of second data connection lines DCL2. In the embodiment of the present disclosure, the interlayer insulation layer ILD exposes the upper surface, located in the bending area BA, of a portion of the flexible substrate SUB. The interlayer insulation layer ILD may include, for example, a silicon compound, metal oxide and the like.

For example, the first source-drain electrically-conductive layer SD1 is arranged on the interlayer insulation layer ILD. The first source-drain electrically-conductive layer SD1, for example, includes the source electrode 114 and the drain electrode 116 which are located in the display area PA. For example, the source electrode 114 is electrically connected with the source area, and the drain electrode 116 is electrically connected with the drain area. In the embodiment of the present disclosure, the first source-drain electrically-conductive layer SD1 further includes a first source-drain electrically-conductive located in the peripheral transition area PTA and the welding transition area WTA, so that the first source-drain electrically-conductive exposes the first layer-change area RA1, the bending area BA and the second layer-change area RA2. In the embodiment of the present disclosure, the first source-drain electrically-conductive layer SD1 includes a plurality of patterns; the source electrode 114, the drain electrode 116, and the first source-drain electrically-conductive pattern are different patterns in the first source-drain electrically-conductive layer SD1, and they may be insulated from one another, or may be electrically conducted with one another. The first source-drain electrically-conductive layer SD1 may include metal, alloy, metal nitride, electrically-conductive metal oxide, a transparent electrically-conductive material and the like; for example, the first source-drain electrically-conductive layer SD1 may have a single layer or multiple layers made from metal, such as Mo/Al/Mo or Ti/Al/Ti. In FIG. 7, a TFT 110 includes the gate electrode 112, the source electrode 114, the drain electrode 116 and the semiconductor layer 118. The TFT 110 in FIG. 7 may be one (for example, the driving TFT Td) of the TFTs included in the pixel circuit PC, as described above with reference to FIG. 2.

In at least some embodiments, the organic insulation layer OIL includes at least one planarization layer. For example, as illustrated in FIG. 7 and FIG. 9, the organic insulation layer OIL includes a first planarization layer PLN1, and the first planarization layer PLN1 is arranged on the first source-drain electrically-conductive layer SD1. For example, the first planarization layer PLN1 includes a first planarization pattern located in the display area DA, and the first planarization pattern covers the source electrode 114 and the gate electrode 112 in the display area DA; the first planarization pattern may have a substantially flat upper surface. In the embodiments of the present disclosure, the first planarization layer PLN1 further includes a first barrier pattern 241 located in the peripheral area PA. For example, the first barrier pattern 241 surrounds the periphery of the display area DA, and is used as a portion of the second barrier 22. In the embodiments of the present disclosure, the first planarization pattern and the first barrier pattern 241 are different patterns in the first planarization layer PLN1. In the embodiments of the present disclosure, the first planarization layer PLN1 covers the exposed upper surface of the substrate located in the bending area BA, so that elasticity of the bending area BA can be reinforced and the bending area BA is not liable to fracture. The first planarization layer PLN1 may include an organic insulation material, and the organic insulation material, for example, includes resin materials such as polyimide, epoxy resin, acryl, polyester, a photoresist, polyacrylate, polyamide, siloxane and the like. For another example, the organic insulation material includes an elastic material, e.g., ethyl carbamate, thermoplastic polyurethane (TPU) and the like.

For example, a second source-drain electrically-conductive layer SD2 is arranged on the first planarization layer PLN1. The second source-drain electrically-conductive layer SD2, for example, includes a transferring electrode 140 located in the display area DA. As illustrated in FIG. 7, the transferring electrode is electrically connected with the drain electrode through a contact hole formed in the first planarization layer PLN1, and meanwhile, the transferring electrode is also electrically connected with a first electrode 132 through another contact hole formed in a second planarization layer PLN2. In this embodiment, by using the transferring electrode, the need for forming a contact hole with a large hole diameter in the first planarization layer PLN1 and the second planarization layer PLN2 can be eliminated, so that quality of electrical connection of the contact hole is increased. In the embodiments of the present disclosure, the second source-drain electrically-conductive layer SD2 further includes a second source-drain electrically-conductive pattern, which is located in the first layer-change area RA1, the bending area BA, the second layer-change area RA2, and the welding transition area WTA; the second source-drain electrically-conductive pattern is located in two openings respectively in the first layer-change area RA1 and the second layer-change area RA2, thereby facilitating the layer-level change of the touch signal line 5. In the embodiments of the present disclosure, the second source-drain electrically-conductive layer SD2 includes a plurality of patterns; the transferring electrode and the second source-drain electrically-conductive pattern are different patterns in the second source-drain electrically-conductive layer SD2, and they may be insulated from each other, or may be electrically conducted with each other. For example, the second source-drain electrically-conductive layer SD2 may include metal, alloy, metal nitride, electrically-conductive metal oxide, a transparent electrically-conductive material and the like, and for example, the second source-drain electrically-conductive layer SD2 may have a single layer or multiple layers made from metal, such as Mo/Al/Mo or Ti/Al/Ti. The material of the second source-drain electrically-conductive layer SD2 may be the same as or different from the material of the first source-drain electrically-conductive layer SD1.

In at least some embodiments, the organic insulation layer OIL further includes the second planarization layer PLN2. For example, as illustrated in FIG. 7 and FIG. 9, the second planarization layer PLN2 is arranged on the second source-drain electrically-conductive layer SD2. For example, the second planarization layer PLN2 includes a second planarization pattern located in the display area DA, the second planarization pattern covers the transferring electrode, and the second planarization pattern may have a substantially flat upper surface. In the embodiments of the present disclosure, the second planarization layer PLN2 further includes two second barrier patterns 242 located in the peripheral area PA, each second barrier pattern 242 surrounds the periphery of the display area DA. For example, in FIG. 9, a second barrier pattern 242a on the left side is in direct contact with a first source-drain electrode layer and serves as a portion of the first barrier 21; and a second barrier pattern 242b on the right side covers the first barrier pattern 241 and serves as a portion of the second barrier 22. In the embodiments of the present disclosure, the second planarization layer PLN2 exposes the first layer-change area RA1 and the second layer-change area RA2. In the embodiments of the present disclosure, the second planarization pattern and the second barrier 242 are different patterns in the second planarization layer PLN2. The second planarization layer PLN2 may include an organic insulation material, and the organic insulation material, for example, includes resin materials, such as polyimide, epoxy resin, acryl, polyester, a photoresist, polyacrylate, polyamide, siloxane and the like. For another example, the organic insulation material includes an elastic material, e.g., ethyl carbamate, thermoplastic polyurethane (TPU) and the like. The material of the second planarization layer PLN2 may be the same as or different from the material of the first planarization layer PLN1.

For example, as illustrated in FIG. 7, an organic light-emitting diode 130 includes the first electrode 132, an organic functional layer 134 and a second electrode 136. The organic light-emitting diode 130 in FIG. 7 may be the organic light-emitting diode OLED described above with reference to FIG. 2.

For example, the first electrode 132 is arranged on the second planarization layer PLN2. The first electrode 132 is electrically connected with the transferring electrode through a contact hole in the second planarization layer PLN2, so as to be electrically connected with the drain electrode of the TFT 110. The first electrode 132 may include a electrically-conductive material. The electrically-conductive material, for example, may include metal, metal alloy, metal nitride, electrically-conductive metal oxide, a transparent electrically-conductive material and the like. The first electrode 132 may have a multi-player structure.

For example, a pixel definition layer PDL is arranged on the second planarization layer PLN2. For example, as illustrated in FIG. 7, the pixel definition layer PDL includes a first pixel definition pattern located in the display area DA, and the first pixel definition pattern may expose a portion of the first electrode 132. For example, the organic functional layer 134 is arranged on the portion of the first electrode 132, which is exposed by the first pixel definition pattern. In the embodiments of the present disclosure, the pixel definition layer PDL further includes two second pixel definition patterns 243a and 243b arranged in the peripheral area PA, each of the two second pixel definition patterns surrounds the periphery of the display area DA. For example, in FIG. 9, the second pixel definition pattern 243a on the left side covers the second barrier pattern 242a on the left side and serves as a portion of the first barrier 21, and the second pixel definition pattern 243b on the right side covers the second barrier pattern 242b on the right side and serves one portion of the second barrier 22. In the embodiments of the present disclosure, the pixel definition layer PDL exposes the first layer-change area RA1 and the second layer-change area RA2, so as to facilitate the layer-level changing of the signal line. The pixel definition layer PDL may include an organic material or an inorganic material. The material of the pixel definition layer PDL may include organic insulation materials such as polyimide, polyphthalimide, polyamide, acrylic resin, benzocyclobutene or phenolic resin and the like, or include inorganic insulation materials such as silicon oxide, silicon nitride and the like. The pixel definition layer PDL may have a multi-layer structure, and for example, as illustrated in FIG. 7, the pixel definition layer PDL includes a first pixel definition layer PDL1 and a second pixel definition layer PDL2 which are laminated with each other.

For example, the organic functional layer 134 may include a light-emitting layer. The light-emitting layer may include a small molecule organic material or a polymer molecule organic material, may be a fluorescence light-emitting material or a phosphorescence light-emitting material. The light-emitting layer emits red light, green light, blue light or white light. Further, as required, the organic functional layer 134 may further include a hole injection layer, a hole transport layer, an electron injection layer, an electron transport layer and the like.

The second electrode 136 may include an electrically-conductive material, and for example, the electrically-conductive material may include metal, metal alloy, metal nitride, electrically-conductive metal oxide, a transparent electrically-conductive material and the like. In the embodiments of the present disclosure, the organic light-emitting diode OLED may adopt a top-emitting type or a bottom-emitting type. In a situation where the top-emitting type OLED is adopted, the first electrode 132 includes an electrically-conductive material with a light reflecting property or includes a light reflecting film; the second electrode 136 includes a transparent or translucent electrically-conductive material. In a situation where the bottom-emitting type OLED is adopted, the second electrode 136 includes the electrically-conductive material with the light reflecting property or includes the light reflecting film, and the first electrode 132 includes the transparent or translucent electrically-conductive material.

For example, an encapsulation layer EPL is arranged on the pixel definition layer PDL. As illustrated in FIG. 7, the encapsulation layer EPL covers the organic light-emitting diode in the display area DA and covers the first pixel definition pattern in the display area DA to seal the organic light-emitting diode, so that deterioration of the organic light-emitting diode, which is caused by moisture and/or oxygen included in the environment, can be reduced or prevented. The encapsulation layer EPL may be of a single layer structure, or may be of a multi-layer structure. The multi-layer structure includes a structure made up of stacking an inorganic layer and an organic layer. For example, the encapsulation layer EPL may include a first inorganic encapsulation layer EPL1, an organic encapsulation layer EPL2 and a second inorganic encapsulation layer EPL3 which are sequentially arranged. Further, the encapsulation layer EPL extends to the peripheral area PA so as to cover the first barrier 21 and the second barrier 22 in the peripheral area PA. In the embodiments of the present disclosure, the encapsulation layer EPL exposes the first layer-change area RA1, the bending area BA, the second layer-change area RA2, the welding transition area WTA and the welding area WA.

For example, a material of the encapsulation layer EPL may include an insulation material, such as silicon oxynitride (SiON), silicon oxide (SiOx), silicon nitride (SiNx), high molecular resin and the like. Inorganic materials, such as silicon oxynitride (SiON), silicon oxide (SiOx), silicon nitride (SiNx) and the like, have high compactness, and can prevent invasion of water, oxygen and the like. A material of the organic encapsulation layer may be a high molecular material containing a desiccant. Alternatively, the material of the organic encapsulation layer may be a high molecular material capable of blocking water vapor and the like, for example, the high molecular resin, so that planarization processing is carried out on the surface of the display substrate and stresses of the first inorganic encapsulation layer and the second inorganic encapsulation layer can be relieved. The high molecular resin may further include a water absorbent material, such as the desiccant and the like, so as to absorb invading substances such as water, oxygen and the like.

For example, a second barrier layer BRL2 is arranged on the encapsulation layer EPL. The second barrier layer BRL2 is located in the display area DA and extends to the peripheral area PA so as to cover the encapsulation layer EPL. In the embodiments of the present disclosure, the second barrier layer BRL2 exposes the first layer-change area RA1, the bending area BA, and the second layer-change area RA2. The second barrier layer BRL2 may adopt the same material as the first barrier layer BRL1, which is not repeated herein. According to the embodiments of the present disclosure, the first gate insulation layer GIL the second gate insulation layer GI2, the buffer layer BFL, the second barrier layer BRL2, and the first barrier layer BRL1 are arranged on the flexible substrate SUB, however, it can be understood that, in some examples, the number of the layers on the flexible substrate SUB may be decreased or increased according to actual demands, and the present disclosure does not make any specific limit thereto.

Figure 11:
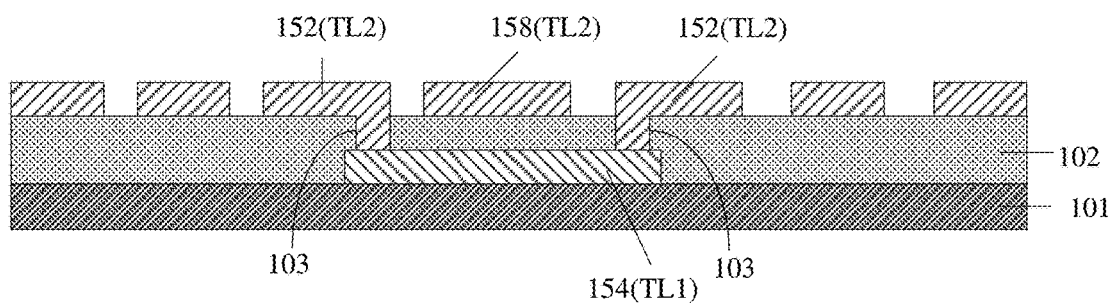
FIG. 11 is a sectional schematic diagram of a first touch electrically-conductive layer and a second touch electrically-conductive layer according to an embodiment of the present disclosure.

In at least some embodiments, a first touch electrically-conductive layer TL1 is arranged on one side of the second planarization layer PLN2 distal to the flexible substrate SUB. For example, as illustrated in FIG. 7, the first touch electrically-conductive layer TL1 is arranged on the second barrier layer BRL2. A touch insulation layer TIL is arranged between the first touch electrically-conductive layer TL1 and a second touch electrically-conductive layer TL2. For example, in the embodiments of the present disclosure, each touch electrode TE in the display area DA includes an upper layer and a lower layer. The lower layer is the first touch electrically-conductive layer TL1, the upper layer is the second touch electrically-conductive layer TL2, and they are insulated from each other through the touch insulation layer TIL. In the peripheral area PA, each touch signal line 5 also includes an upper layer and a lower layer, the lower layer is the first touch electrically-conductive layer TL1, the upper layer is the second touch electrically-conductive layer TL2, and they are insulated from each other through the touch insulation layer TIL. The touch insulation layer TIL of each touch signal line 5 is provided with contact holes, through which the first touch electrically-conductive layer TL1 is electrically connected with the second touch electrically-conductive layer TL2, so that two touch electrically-conductive layers can be used for transmitting the same signal, and a transmission resistance can be reduced. Further, in at least one example, as illustrated in FIG. 11, the first touch electrically-conductive layer TL1 and the second touch electrically-conductive layer TL2 are arranged on a first insulation layer 101 in the display area DA, a second insulation layer 102 is arranged between the first touch electrically-conductive layer TL1 and the second touch electrically-conductive layer TL2. For example, the first touch electrically-conductive layer TL1 includes a bridge electrode 154, and the second touch electrically-conductive layer TL2 includes a touch electrode (TX electrode) 158 and a sensing electrode (RX electrode) 152. The RX electrode 152 is electrically connected with the bridge electrode 154 through a via hole 103 disposed in the second insulation layer 102. In at least one example, the purpose of transmitting the signal may also be achieved by only using one single touch electrically-conductive layer (the first touch electrically-conductive layer TL1 or the second touch electrically-conductive layer TL2) as the touch signal line 5. In the embodiments of the present disclosure, the first touch electrically-conductive layer TL1 exposes the bending area BA, and the second touch electrically-conductive layer TL2 exposes the first layer-change area RA1, the bending area BA and the second layer-change area RA2. Each of the first touch electrically-conductive layer TL1 and the second touch electrically-conductive layer TL2 may include an electrically-conductive material. The electrically-conductive material, for example, may include metal, metal alloy, metal nitride, electrically-conductive metal oxide, a transparent electrically-conductive material and the like.

In at least some embodiments, an overcoat layer OC is arranged on one side of the second touch electrically-conductive layer TL2 distal to the flexible substrate SUB. The overcoat layer OC extends from the display area DA to the peripheral area PA, and the overcoat layer OC can protect the touch signal line 5 in the peripheral transition area PTA. A material of the overcoat layer may include an inorganic insulation material or an organic insulation material.

In at least some embodiments, the layer-level of the signal line extending from the display area DA to the welding area WA is changed in both the first layer-change area RA1 of the peripheral transition area PTA and the second layer-change area RA2 in the welding transition area WTA, so that a portion of the signal line inside the bending area BA and a portion of the signal line outside the bending area BA have different wiring layout, but the two portions of the same signal line are kept being electrically connected to each other. Thus, not only can the space utilization ratio be increased, but also the thickness of the film layers in the non-display area (an area except for the display area DA) can be reduced.

In at least some embodiments, the touch signal line 5 includes a portion inside the bending area BA and another portion outside the bending area BA, and the portion inside the bending area BA is different from the another portion outside the bending area BA in their wiring layouts. For example, as illustrated in FIG. 8 and FIG. 9, each of the touch signal lines 5 includes a first touch portion 502 located in the bending area BA and a second touch portion 504 located outside the bending area BA, and the first touch portion 502 of the touch signal line 5 and the second touch portion 504 of the touch signal line 5 are located in different film layers. That is, the first touch portion 502 and the second touch portion 504 are located on different layer levels. For example, as illustrated in FIG. 9, the first touch portion 502 is located between the first planarization layer PLN1 and the second planarization layer PLN2, while the second touch portion 504 is located on the second planarization layer PLN2, for example, the second touch portion 504 is located on the encapsulation layer EPL. Further, in the embodiments of the present disclosure, the first touch portion 502 and the second touch portion 504 include different film layers. For example, the first touch portion 502 of the touch signal line 5 includes the second source-drain electrically-conductive layer SD2 in the bending area BA; further, for example, the first touch portion 502 is composed of the second source-drain electrically-conductive layer SD2 in the bending area BA. In the peripheral transition area PTA and the welding transition area WTA, the second touch portion 504 includes the first touch electrically-conductive layer TL1 and the second touch electrically-conductive layer TL2; further, for example, the second touch portion 504 is formed of the first touch electrically-conductive layer TL1 and the second touch electrically-conductive layer TL2 which are connected to each other in parallel. Thus, it can be seen that the first touch portion 502 and the second touch portion 504 are composed of different film layers. For example, in the first layer-change area RA1, the second touch electrically-conductive layer TL2 in the second touch portion 504 of the touch signal line 5 is in lapped connection with the second source-drain electrically-conductive layer SD2 in the first touch portion 502 of the touch signal line 5 through an opening 511 in the second planarization layer PLN2. For another example, in the second layer-change area RA2, the second touch electrically-conductive layer TL2 in the second touch portion 504 of the touch signal line 5 is in lapped connection with the second source-drain electrically-conductive layer SD2 in the first touch portion 502 of the touch signal line 5 through an opening 512 in the second planarization layer PLN2. By adopting the layer-change design of the touch signal line 5, not only a thickness of an electrically-conductive film layer in the bending area BA can be reduced and influence of bending on signal transmission can be avoided, but also safety and the space utilization ratio of the signal line can be increased.

For example, as illustrated in FIG. 3, the common signal line 6 is arranged in the peripheral area PA, and partially surrounds the display area DA in an open-loop mode. The common signal line 6 is configured to be electrically connected with the organic light-emitting element so as to provide a common voltage ELVSS, as illustrated in FIG. 2.

Figure 12:
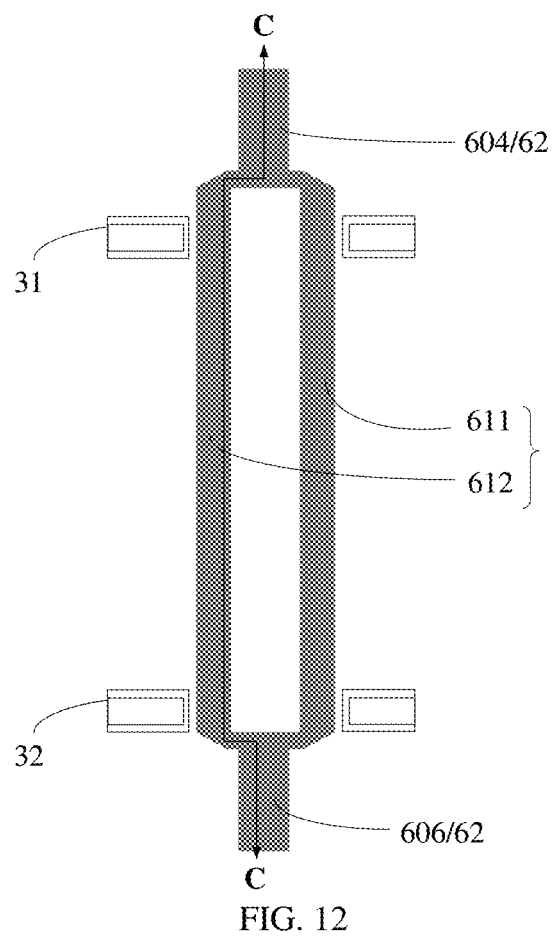
FIG. 12 is a planar schematic diagram of a common signal line according to an embodiment of the present disclosure.
Figure 13:
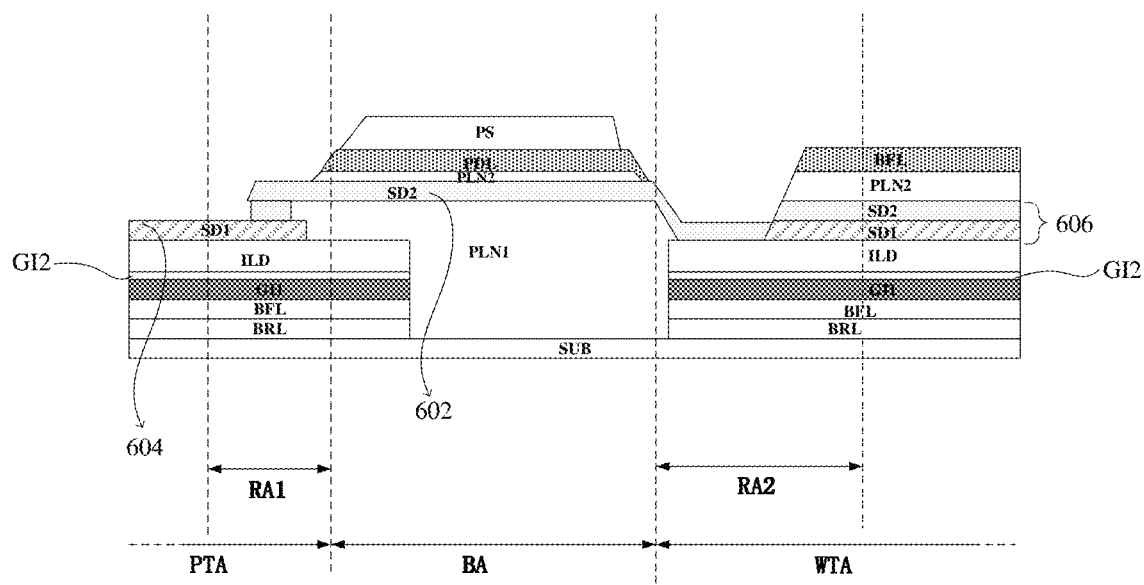
FIG. 13 is a section view along a line C-C in FIG. 12.

In at least some embodiments, the common signal line 6 led out from the peripheral area PA to the welding area WA includes a portion inside the bending area BA and another portion outside the bending area BA, and the portion inside the bending area BA is different from the another portion outside the bending area BA in their wiring layouts. FIG. 12 is a planar schematic diagram of a common signal line according to an embodiment of the present disclosure. FIG. 13 is a section view along a line C-C in FIG. 12. For example, as illustrated in FIG. 12 and FIG. 13, each common signal line 6 includes a first common portion 602 located in the bending area BA and a second common portion 62 located outside the bending area BA, and the first common portion 602 and the second common portion 62 are located in different film layers. That is, the first common portion 602 and the second common portion 62 are located on different layer levels. For example, as illustrated in FIG. 13, the first common portion 602 is located on the first planarization layer PLN1 and between the first planarization layer PLN1 and the second planarization layer PLN2, while the second common portion 62 is located on the interlayer insulation layer ILD. By adopting the layer-change design of the common signal line 6, not only the thickness of the electrically-conductive film layer in the bending area BA can be reduced and influence of bending on signal transmission can be avoided, but also safety and the space utilization ratio of the signal line can be increased. Further, in at least one example, the second common portion 62 includes a first common sub portion 604 located in the peripheral transition area PTA and a second common sub portion 606 located in the welding transition area WTA. In the embodiments of the present disclosure, the first common portion 602, the first common sub portion 604 and the second common sub portion 606 are composed of different film layers. For example, the first common portion 602 is composed of the second source-drain electrically-conductive layer SD2 in the bending area BA. The second common sub portion 606 may have the same single-layer structure as the first common sub portion 604, i.e., is composed of the first source-drain electrically-conductive layer SD1; alternatively, the second common sub portion 606 may have a different structure from the first common sub portion 604, for example, the second common sub portion 606 has a double-layer structure. As illustrated in FIG. 13, in a situation where the second common sub portion 606 is composed of the first source-drain electrically-conductive layer SD1 and the second source-drain electrically-conductive layer SD2, resistance for signal transmission can be reduced, and thus, it is preferred.

In the embodiments of the present disclosure, as illustrated in FIG. 8, an overlapping area is formed between an orthographic projection of the second common portion 62 of the common signal line 6 on the flexible substrate SUB and an orthographic projection of the second touch portion 504 of the touch signal line 5 on the flexible substrate SUB, which not only avoid mutual interference between different signal lines, but also can increase the space utilization ratio. In the embodiments of the present disclosure, the first common portion 602 may include a first common branch 611 and a second common branch 612, and the first common branch 611 and the second common branch 612 adopt the same wiring layout so as to facilitate production. In addition, by arranging the first common branch 611 and the second common branch 612, both the first common portion 602 and the first touch portion 502 are arranged in the same layer (i.e., in the second source-drain electrically-conducted layer) in the bending area BA and are insulated from each other. That is, no overlapping area is formed between an orthographic projection of the first common portion 602 of the common signal line 6 on the flexible substrate SUB and an orthographic projection of the first touch portion 502 of the touch signal line 5 on the flexible substrate SUB, so that a film layer thickness in the bending area BA is reduced to maximum degree, and the risk of fracture of the bending area BA can be reduced.

Figure 14:
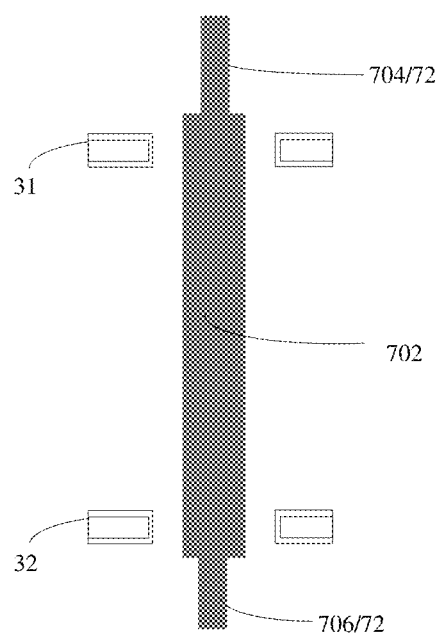
FIG. 14 is an enlarged planar schematic diagram of an area Q2 of the flexible display panel in FIG. 3.

In at least some embodiments, the driving signal line 7 led out from the peripheral area PA to the welding area WA includes a portion inside the bending area BA and another portion outside the bending area BA, and the portion inside the bending area BA is different from the another portion outside the bending area BA in their wiring layouts. As illustrated in FIG. 3, the driving signal line 7 is located on one side of the common signal line 6, which is proximal to the second fanout area FA2, and the driving signal line 7 is configured to be electrically connected with the pixel circuit PC. FIG. 14 is an enlarged planar schematic diagram of an area Q2 of the flexible display panel in FIG. 3. For example, as illustrated in FIG. 14, the driving signal line 7 includes a first driving portion 702 located in the bending area BA and a second driving portion 72 located outside the bending area BA, and the first driving portion 702 and the second driving portion 72 are located on different film layers. In at least one example, the second driving portion 72 of the driving signal line 7 includes a first driving sub portion 704 located in the peripheral transition area PTA and a second driving sub portion 706 located in the welding transition area WTA. The layer-change design of the driving signal line 7 is the same as the layer-change design of the common signal line 6 illustrated in FIG. 13, however, the driving signal line 7 differs from the common signal line 6 in that: the first driving portion 702 of the driving signal line 7 does not have a branch structure. Thus, the first driving portion 702 of the driving signal line 7 is composed of the second source-drain electrically-conductive layer SD2 in the bending area BA, the first driving sub portion 704 of the driving signal line 7 is composed of the first source-drain electrically-conductive layer SD1, and the second driving sub portion 706 of the driving signal line 7 is composed of the first source-drain electrically-conductive layer SD1 and the second source-drain electrically-conductive layer SD2.

In at least some embodiments, the data connection line DCL led out from the peripheral area PA to the welding area WA includes a portion inside the bending area BA and another portion outside the bending area BA, and the portion inside the bending area BA is different from the another portion outside the bending area BA in their wiring layouts. The data connection line DCL extends from the display area DA, passes through the first fanout area FA1, the bending area BA and the second fanout area FA2, and finally reaches the welding area WA. For example, a portion of the data connection line DCL, which is located in each of the first fanout area FA1 and the second fanout area FA2, is composed of the first gate electrode layer G1 and the second gate electrode layer G2 which are alternately arranged. A portion of the data connection line DCL, which is located in the bending area BA, is composed of the second source-drain electrically-conductive layer.

Figure 10:
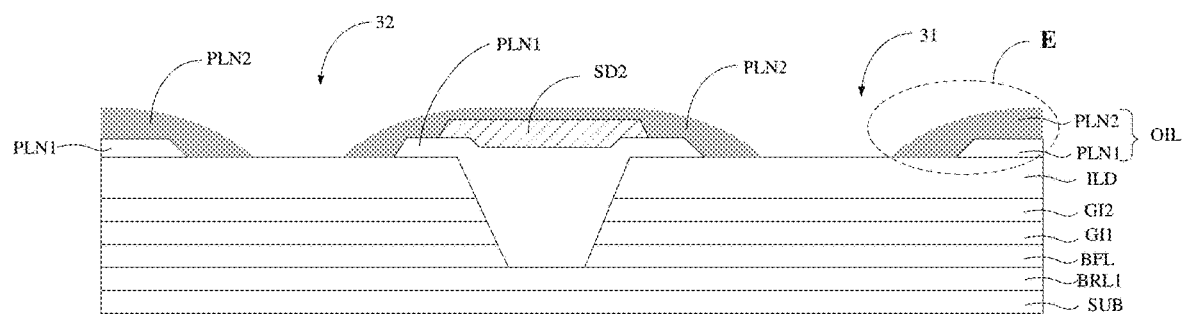
FIG. 10 is a sectional schematic diagram along a line B-B in FIG. 8.
Figure 15:
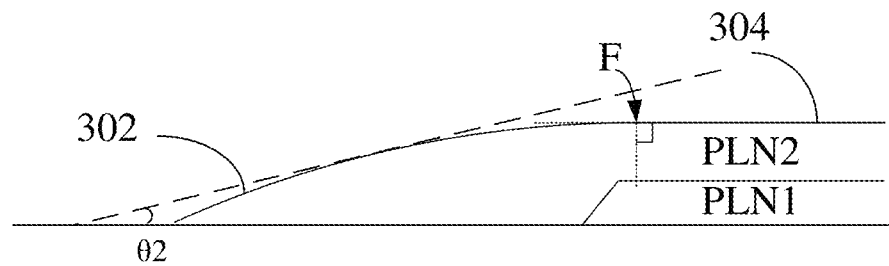
FIG. 15 is an enlarged planar schematic diagram of an area E in FIG. 10.
Figure 16:
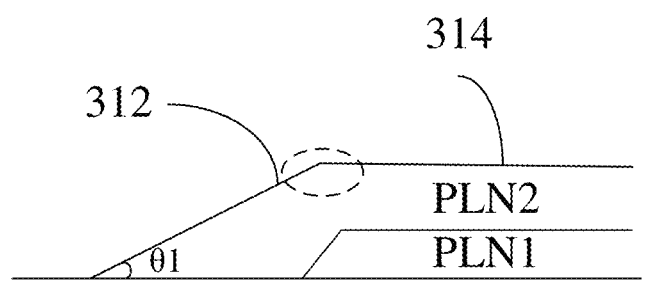
FIG. 16 is a schematic diagram of another modification of a side wall of a first groove according to an embodiment of the present disclosure.

In at least some embodiments, the first groove 31 penetrates through the organic insulation layer OIL. For example, the organic insulation layer OIL includes only the first planarization layer PLN1, and the first groove 31 penetrates the first planarization layer PLN1. For another example, the organic insulation layer OIL includes the first planarization layer PLN1 and the second planarization layer PLN2, and the first groove 31 penetrates both the first planarization layer PLN1 and the second planarization layer PLN2. FIG. 10 is a sectional schematic diagram along a line B-B in FIG. 8. For example, as illustrated in FIG. 10, each of the first groove 31 and the second groove 32 penetrates both the first planarization layer PLN1 and the second planarization layer PLN2. For example, the first groove 31 includes a side wall, and the side wall is a side surface of the second planarization layer PLN2 encasing the first planarization layer PLN1. The description below on the side wall of the first groove 31 is understood as the description on the side surface of the second planarization layer PLN2, and the embodiments of the present disclosure will not repeatedly embodiments, the side wall may be a planar slope surface inclined with respect to a plane where the flexible substrate SUB is located, or the side wall may be an arc-shaped slope surface. FIG. 15 is an enlarged planar schematic diagram of an area E in FIG. 10. As illustrated in FIG. 15, a side wall 302 is an arc-shaped slope surface. FIG. 16 is a schematic diagram of another modification of a side wall of a first groove according to an embodiment of the present disclosure. As illustrated in FIG. 16, a side wall 312 is a planar slope surface which is inclined. In FIG. 16, an included angle θ1 between the side wall 312 and the plane where the flexible substrate SUB is located is approximately from 20 degrees to 40 degrees, so that the side wall can be in smooth transition to the bottom of the groove from a top surface 314, which not only can be easy to disperse the bending stress, but also can reduce a step difference generated by the groove. However, it is possible that a protrusion edge (dashed box) may be formed at a joint of the side wall 312 and the top surface 314 at the peripheral edge of the groove in FIG. 16, in this case, the bending stress generated in the bending area BA may not be well dispersed. In order to avoid formation of the protrusion edge, the side wall of the first groove 31 having an arc-shaped slope surface is preferred; further, in at least one example, as illustrated in FIG. 15, the arc-shaped slope surface is connected with the top surface 304 of the second planarization layer PLN2 at the peripheral edge of the first groove 31, and the arc-shaped slope surface is tangent to the top surface 304 at a joint F. Therefore, the protrusion edge cannot be formed at the joint F between the side wall 302 and the top surface 304, i.e., a stress concentration point cannot be formed. In a situation where the bending area BA is bent, the bending stress cannot be concentrated at the joint F, so that the bending stress generated by the bending area BA can be dispersed better. Further, in at least one example, in a situation where the side wall is the arc-shaped slope surface, a maximum value θ2 of an included angle between a tangent line of the side wall and the flexible substrate SUB is approximately from 20 degrees to 40 degrees. Therefore, the step difference generated by the groove can also be reduced.

Figure 17:
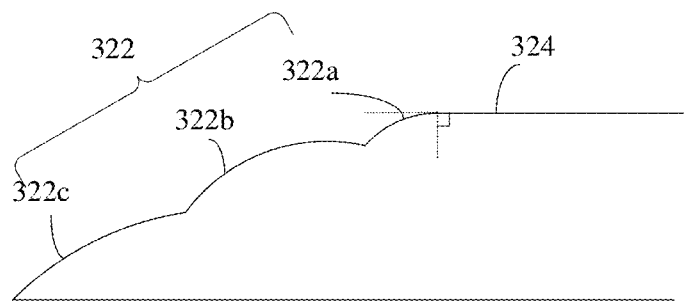
FIG. 17 is a schematic diagram of yet another modification of a side wall of a first groove according to an embodiment of the present disclosure.

In at least some embodiments, the side wall of the first groove 31 may be stepped shaped. FIG. 17 is a schematic diagram of yet another modification of a side wall of a first groove according to an embodiment of the present disclosure. For example, as illustrated in FIG. 17, in a plane perpendicular to an extending direction of the first groove 31, a side wall 322 includes a plurality of side portions 322a, 322b and 322c. Each of the side portions has an arc-shaped slope surface, and a plurality of arc-shaped slope surfaces are connected with one another to form the side wall 322, so as to form the step-shaped side wall. By arranging a plurality of side portions, the bending stress can be dispersed into the plurality of side portions. In FIG. 17, the arc-shaped slope surface of the side portion 322a which is the farthest distal to the flexible substrate SUB is tangent to the top surface 324 at the joint, so that formation of the protrusion edge at the joint can be avoided, the top surface is in smooth transition to the side wall, and the stress concentration point cannot be formed. It should be understood that structures of the second groove 32, the third groove 33 and the fourth groove 34 in the embodiments of the present disclosure may be same as the first groove 31, which are not repeated herein.

In at least some embodiments, as illustrated in FIG. 3, the barrier 2 includes the first barrier 21 and the second barrier 22. The first barrier 21 is located in the peripheral area PA and surrounds the display area DA. The second barrier 22 is located in the peripheral area PA and surrounds the display area DA, and the second barrier 22 is located on one side of the first barrier 21 distal to the display area DA, so that external water vapor or oxygen can be further prevented from entering the display area DA, thereby providing double protection for the display area DA.

In at least one example, as illustrated in FIG. 3, the first barrier 21 includes a first barrier portion 210 located in the peripheral transition area PTA and a second barrier portion 212 arranged in other areas of the peripheral area PA except the peripheral transition area PTA. The second barrier 22 includes a third barrier portion 220 located in the peripheral transition area PTA and a fourth barrier portion 222 arranged in other areas of the peripheral area PA except the peripheral transition area PTA. As illustrated in FIG. 9, the first barrier portion 210 includes the second planarization layer PLN2 and the pixel definition layer PDL. In at least one example, the first barrier portion 210 is composed of the second planarization layer PLN2 and the pixel definition layer PDL. As illustrated in FIG. 9, the third barrier portion 220 includes the first planarization layer PLN1, the second planarization layer PLN2 encasing the first planarization layer PLN1, and the pixel definition layer PDL encasing the second planarization layer PLN2. In at least one example, the third barrier portion 220 is composed of the first planarization layer PLN1, the second planarization layer PLN2 encasing the first planarization layer PLN1, and the pixel definition layer PDL encasing the second planarization layer PLN2. In the embodiments of the present disclosure, compared to the third barrier portion 220, the first barrier portion 210 doesn't include first planarization layer PLN1, and thus, a height of the first barrier portion 210 with respect to the flexible substrate SUB is smaller than a height of the third barrier portion 220 with respect to the flexible substrate SUB, so that a path for external water vapor and oxygen to enter the display area DA is lengthened and the difficulty in entering the display area DA is increased, thereby further increasing the blocking ability of the barrier.

In at least some embodiments, the side surface of the second planarization layer PLN2 in the first barrier portion 210 and/or the second barrier portion 212 may have the structure of the side wall of the above-mentioned first groove 31. Further, in at least one example, the side surface of the second planarization layer PLN2 in each of the first barrier portion 210 and the second barrier portion 212 may have the structure of the side wall of the above-mentioned first groove 31. For example, a side surface 410 of the second planarization layer PLN2 in the first barrier portion 210 and a side surface 412 of the second planarization layer PLN2 in the second barrier portion 212 are arc-shaped slope surfaces as illustrated in FIG. 15; alternatively, the side surface 410 of the second planarization layer PLN2 in the first barrier portion 210 and the side surface 412 of the second planarization layer PLN2 in the second barrier portion 212 are planar slope surfaces inclined with respect to the plane where the flexible substrate SUB is located, for example, the planar slope surfaces illustrated in FIG. 16. In at least one example, in a situation where the side surface of the second planarization layer PLN2 is a planar slope surface, an included angle between the side surface of the second planarization layer PLN2 and the plane where the flexible substrate SUB is located is approximately from 20 degrees to 40 degrees, so that the side wall can be in smooth transition from the top surface of the second planarization layer PLN2 to the first source-drain electrically-conductive layer SD1, thereby decrease a slope angle between the slope surface and the first source-drain electrically-conductive layer SD1. In at least one example, in a situation where the side surface of the second planarization layer PLN2 is the arc-shaped slope surface, a maximum value of an included angle between a tangent line of the side wall of the second planarization layer PLN2 and the flexible substrate SUB is approximately from 20 degrees to 40 degrees. In this way, the slope angle of the side wall can also be gradually decreased. The decreased slope angle can reduce a step difference of the film layer related to the signal line and formed on the barrier, so as to avoid residual signal line materials in a manufacturing process. For example, as illustrated in FIG. 9, in a situation where the first touch electrically-conductive layer TL1 and the second touch electrically-conductive layer TL2 which constitute the first touch signal line 52 are formed on the first barrier portion 210 and the second barrier portion 212, the side surface of the second planarization layer PLN2 decreases the slope angle and reduces the step difference of the first touch electrically-conductive layer TL1 and the second touch electrically-conductive layer TL2, so as to avoid residual touch conductive materials on the substrate while the first touch electrically-conductive layer TL1 and the second touch electrically-conductive layer TL2 are manufactured.

Figure 18:
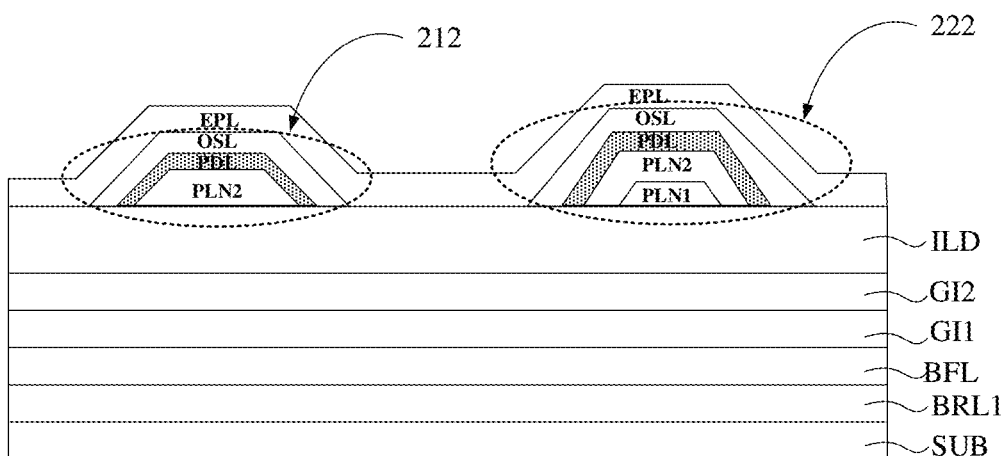
FIG. 18 is a sectional schematic diagram along a line II-II in FIG. 3.

FIG. 18 is a section view along a line II-II in FIG. 3. In at least some embodiments, as illustrated in FIG. 18, the flexible substrate SUB further includes a spacer layer OSL located between the pixel definition layer PDL and the encapsulation layer EPL, and the spacer layer OSL can further lengthen the path for external water vapor or oxygen to enter the display area DA so as to protect the organic light-emitting element in the display area DA. In at least some embodiments, the spacer layer OSL is located in an area of the peripheral area PA except the peripheral transition area PTA. Further, in at least one example, the spacer layer OSL overlays two second pixel definition patterns in the peripheral area PA, so as to respectively constitute a portion of each of the second barrier portion 212 and the fourth barrier portion 222. For example, as illustrated in FIG. 18, the second barrier portion 212 includes the second planarization layer PLN2, the pixel definition layer PDL and the spacer layer OSL, and the fourth barrier portion 222 includes the first planarization layer PLN1, the second planarization layer PLN2 encasing the first planarization layer PLN1, the pixel definition layer PDL encasing the second planarization layer PLN2, and the spacer layer OSL. The spacer layer OSL is not arranged in the peripheral transition area PTA, and thus, the film layer thickness in the non-display area is reduced, and influence of the bending stress on the related film layers is reduced. In the embodiments of the present disclosure, the spacer layer OSL includes an organic material; for example, the material of the pixel definition layer PDL may include organic insulation materials, such as polyimide, polyphthalimide, polyamide, acrylic resin, benzocyclobutene or phenolic resin and the like.

In the embodiments of the present disclosure, a detection area DTA, a controlling circuit area CCA, a third fanout area FA3 and an integrated circuit area IC are disposed between the second fanout area FA2 and the welding area WA of the flexible substrate SUB. In at least one example, the detection area DTA is configured to be connected with an external detecting apparatus to detect an image or disconnection of the bending area BA and the like. In at least one example, the controlling circuit area CCA includes a selector MUM, e.g., a single-pole double-throw switch, for switching between an input circuit and an output circuit.

An embodiment of the present disclosure further provides a flexible display panel, including a flexible substrate, the flexible substrate including: a display area; a peripheral area, surrounding the periphery of the display area; a welding area, on one side of the peripheral area distal to the display area; a bending area, between the peripheral area and the welding area; and a fanout area, between the bending area and the welding area, the fanout area abutting on the bending area. The flexible display panel further includes: an organic insulation layer, on the flexible substrate, wherein a groove is disposed in the organic insulation layer between the bending area and the welding area, and an orthographic projection of the groove on the flexible substrate partially overlaps with the fanout area.

The structure and arrangement of the groove in this embodiment may refer to the description of the second groove in the previous embodiments; the arrangement of the fanout area may refer to the description of the second fanout area in the previous embodiments; other terms, including the display area, the peripheral area, the welding area, the bending area, the barrier, the organic insulation layer and the like, refer to the descriptions of the same terms in the previous embodiments, which are not repeated here. In the flexible display panel, the groove is disposed in the organic insulation layer between the bending area and the welding area, and the orthographic projection of the groove on the flexible substrate partially overlaps with the fanout area. Thus, it is easier to release the bending stress and prevent fracture of the bending area.

An embodiment of the present disclosure further provides a flexible display panel, including: a flexible substrate, the flexible substrate including: a display area; a peripheral area surrounding the periphery of the display area; a welding area on one side of the peripheral area distal to the display area; and a bending area between the peripheral area and the welding area, the bending area being configured to be bent along a bending axis. The flexible display panel further includes an organic insulation layer on the flexible substrate, wherein at least one groove extending along a direction perpendicular to the bending axis is disposed in the organic insulation layer in the bending area.

The structure and arrangement of at least one groove in this embodiment may refer to the description of the third groove and/or the fourth groove in the previous embodiments; and other terms, including the display area, the peripheral area, the welding area, the bending area, the barrier, the organic insulation layer and the like, may refer to the descriptions of the same terms in the previous embodiments can be referred to, which are not repeated here. In the flexible display panel, at least one groove extending along the direction perpendicular to the bending axis is disposed in the organic insulation layer in the bending area. Thus, it is easier to release the bending stress and prevent fracture of the bending area.

An embodiment of the present disclosure further provides a flexible display apparatus, including the flexible display panel according to any one of the previous embodiments.

An embodiment of the present disclosure further provides a method for manufacturing a flexible display panel, including: providing a flexible substrate, the flexible substrate including: a display area; a peripheral area surrounding the periphery of the display area; a welding area on one side of the peripheral area distal to the display area; and a bending area between the peripheral area and the welding area, the bending area being configured to be bent along a bending axis, the bending area including a first edge, the peripheral area includes a peripheral transition area between the bending area and the welding area. The method further includes: forming a barrier on the flexible substrate, the barrier being in the peripheral area and surrounding the periphery of the display area; forming an organic insulation layer on the flexible substrate; and forming a first groove in the organic insulation layer within the peripheral transition area, herein, the first groove is located on one side of the barrier distal to the display area and extends along a direction parallel to the bending axis, the first groove is on one side of the first edge proximal to the display area, and the first groove is formed through a patterning process performed on the organic insulation layer by using a dual-tone mask.

In the manufacturing method of the flexible display panel, the first groove is formed in the organic insulation layer within the peripheral transition area, the first groove is located on one side of the barrier distal to the display area and extends along the direction substantially parallel to the bending axis, and particularly, the first groove is located on one side of the first edge of the bending area proximal to the display area. Thus, it is easier to release a bending stress and prevent fracture of the bending area.

In at least some embodiments, the organic insulation layer includes a first planarization layer and a second planarization layer, and the first groove is formed to penetrate through both the first planarization layer and the second planarization layer.

There may be various methods for forming the first groove in the organic insulation layer; the methods include physical methods, such as a photolithography process, sputtering, and evaporation, and the methods also include chemical methods, such as spin-coating. Among those methods, the photolithography process is preferred, because a side wall of the first groove formed through the photolithography process may have an arc-shaped slope surface or substantially arc-shaped slope surface, which is more beneficial for dispersing the bending stress.

Figure 19A:
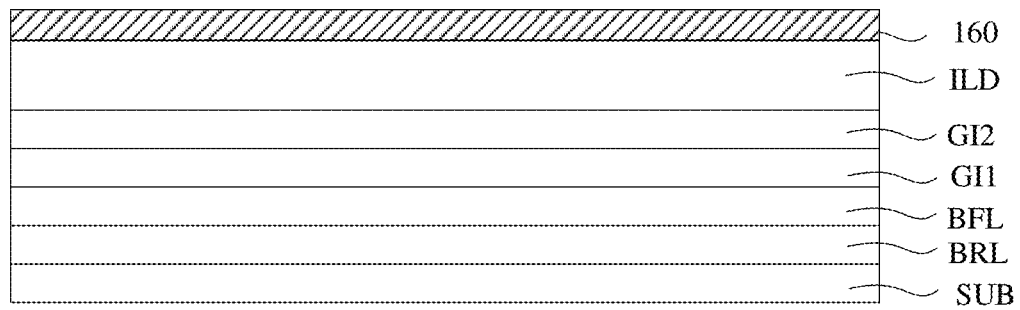
FIG. 19A to FIG. 19D are schematic diagrams of respective steps of forming a first groove according to an embodiment of the present disclosure.

FIG. 19A to FIG. 19D are schematic diagrams of respective steps of forming a first groove according to an embodiment of the present disclosure. In at least one example, the forming the first groove in the organic insulation layer within the peripheral transition area includes:

For example, as illustrated in FIG. 19A, a first planarization thin film 160 is formed on the flexible substrate SUB on which a first barrier layer BRL1, a buffer layer BFL, a first gate insulation layer GI1, a second gate insulation layer GI2, and an interlayer insulation layer ILD are formed.

Figure 19B:
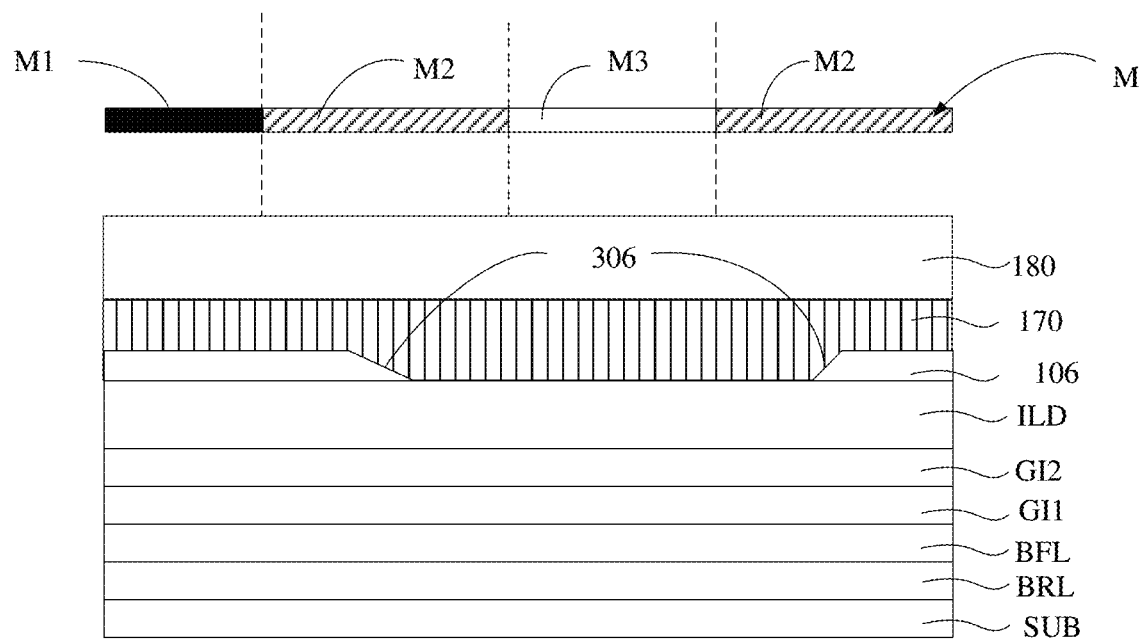

For example, as illustrated in FIG. 19B, the first planarization thin film 160 is patterned to form a first planarization pattern 106, and the first planarization pattern 106 has a first opening 306 in an area where a groove is to be formed correspondingly; next, a second planarization thin film 170 is formed on one side of the first planarization pattern 106 distal to the flexible substrate SUB, and the second planarization thin film 170 overlays the first planarization pattern 106; and then, a photoresist 180 is deposited on the second planarization thin film 170.

The photoresist 180 is exposed by using a mask M. For example, the mask M is a gray mask or a halftone mask. As illustrated in FIG. 19B, for example, the mask M includes a light-blocking area M1, a light-partially-transmitting area M2 and a light-completely-transmitting area M3. The photoresist 180 for example is a positive photoresist. Light transmittance of the light-partially-transmitting area M2 is smaller than light transmittance of the light-completely-transmitting area M3. Thus, in the exposing process, a portion in the photoresist 180 corresponding to the light-completely-transmitting area M3 is completely exposed, a portion in the photoresist 180 corresponding to the light-partially-transmitting area M2 is partially exposed, and a portion in the photoresist 180 corresponding to the light-blocking area M1 is not exposed.

Figure 19C:
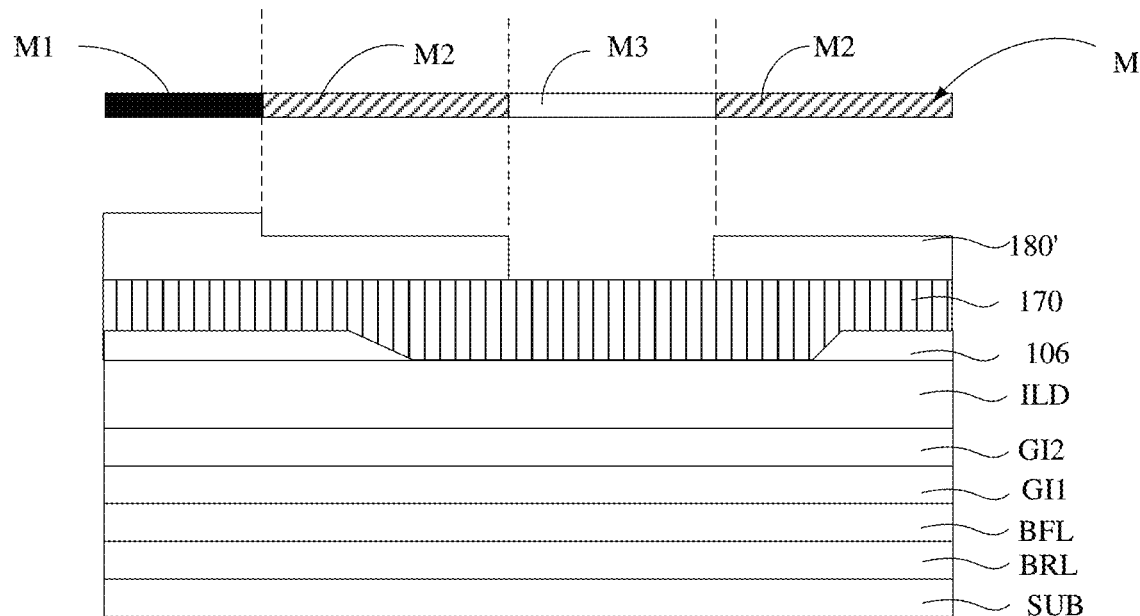

Next, as illustrated in FIG. 19C, the photoresist 180 is developed to obtain a photoresist pattern 180'. The photoresist pattern 180' includes a photoresist-completely-removed area corresponding to the light-completely-transmitting area M3, a photoresist-partially-retained area corresponding to the light-partially-transmitting area M2, a photoresist-completely-retained area corresponding to the light-blocking area M1, and.

Figure 19D:
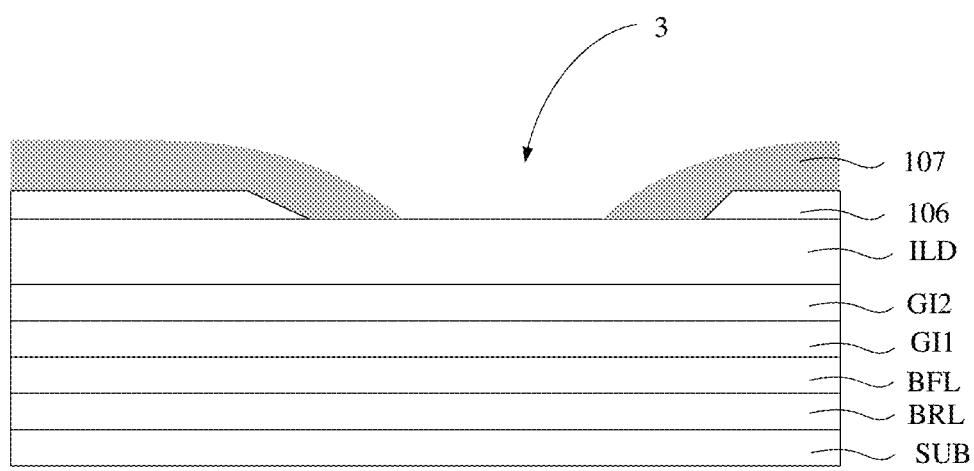

Then, the second planarization thin film 170 is etched by using the photoresist pattern 180'. For example, a portion of the second planarization thin film 170, which corresponds to the photoresist-completely-removed area, is completely etched away. Next, an ashing process is carried out on the photoresist pattern 180', so that the photoresist in the photoresist-completely-retained area is thinned and the photoresist in the photoresist-partially-retained area is completed removed. Then, a portion of the second planarization thin film 170, which corresponds to the photoresist-partially-retained area, is etched away. Finally, the residual photoresist is stripped off. As a result, the second planarization layer as illustrated in FIG. 19D is obtained. It can be seen from FIG. 19D that the first groove 3 penetrates through the first planarization pattern 106 and the second planarization pattern 107, and the side wall of the first groove 3 has an arc-shaped slope surface, so that the side wall is in smooth transition from the top surface of the second planarization pattern to the bottom of the first groove 3, which not only is easy to disperse the bending stress, but also can reduce a step difference generated by the groove.

In the patterning process, a negative photoresist may also be adopted, if so, the adopted mask for example is a mask which has a pattern complementary to the pattern of the mask M. In the manufacturing process of the embodiment of the present disclosure, specific materials of the flexible substrate SUB, the first barrier layer BRL1, the buffer layer BFL, the first gate insulation layer GI1, the second gate insulation layer GI2, the interlayer insulation layer ILD, the organic insulation layer OIL, the first planarization layer PLN1, the second planarization layer PLN2 (including the planarization thin film) and the like, and the arrangement of the first groove, a second groove, a third groove and a fourth groove may refer to the descriptions in the previous embodiments, and is not repeated here.

In at least some embodiments, the organic insulation layer is made up of only the first planarization layer, in this case, the first groove is formed to penetrate through only the first planarization layer. In this case, the specific process for forming the first groove in the first planarization layer may refer to the above-mentioned process for forming the first groove in the second planarization layer, and is not repeated here.

In at least some embodiments, the manufacturing method further includes: forming the second groove in the organic insulation layer of a welding transition area. The second groove may also be formed through the patterning process performed on the organic insulation layer with the dual-tone mask. Further, in at least one example, the first groove and the second groove are formed through the same single process by using the same single dual-tone mask, so that the manufacturing steps can be simplified. It should be understood that a process for forming the second groove may refer to the process for forming the first groove in the previous embodiment, and is not repeated here.

In at least some embodiments, the manufacturing method further includes: forming the third groove and the fourth groove in the bending area. A process for forming the third groove and the fourth groove may refer to the process for forming the first groove in the previous embodiment, and is not repeated here.

In at least some embodiments, the manufacturing method further includes: forming the third groove and the fourth groove in the bending area. A process for forming the third groove and the fourth groove may refer to the process for forming the first groove in the previous embodiment, and is not repeated here.

In at least some embodiments, the method for forming the first groove may also be used to form the second barrier pattern in the second planarization layer as mentioned in the previous embodiments, so that a side surface of the second planarization layer has the same structure as the side wall of the first groove, which is not repeated here.

In this disclosure, several points below should be noted:
(1) The drawings of the embodiments of the present disclosure are only related to structures to which the embodiments of the present disclosure relate, and general design can be referred to for other structures.
(2) For clarity, in the drawings for describing the embodiments of the present disclosure, a thickness of a layer or an area is enlarged or reduced, i.e., those drawings are not drawn according to an actual scale.
(3) In case of no conflict, the embodiments of the present disclosure and the features in the embodiments can be combined with each other to obtain new embodiments.

What is described above is related to the illustrative embodiments of the disclosure only and not limitative to the scope of the disclosure; the scopes of the disclosure are defined by the accompanying claims.

The invention claimed is:

1. A flexible display panel comprising:
a flexible substrate, the flexible substrate comprising:
a display area;
a peripheral area, surrounding a periphery of the display area;
a welding area, on one side of the peripheral area distal to the display area; and
a bending area, between the peripheral area and the welding area, the bending area being configured to be bent along a bending axis, the bending area comprising a first edge;
a barrier, on the flexible substrate, the barrier being in the peripheral area and surrounding the periphery of the display area; and
an organic insulation layer, on the flexible substrate,
wherein the peripheral area comprises a peripheral transition area between the bending area and the display area, the organic insulation layer in the peripheral transition area is provided with a first groove, the first groove is on one side of the barrier and extends along a direction substantially parallel to the bending axis, and the first groove is on one side of the first edge proximal to the display area,
wherein the peripheral transition area comprises a first fanout area, and an orthographic projection of the first groove on the flexible substrate partially overlaps with the first fanout area,
wherein the flexible substrate further comprises:
a second fanout area, between the bending area and the welding area, the second fanout area abutting on the bending area,
wherein the organic insulation layer between the bending area and the welding area is provided with a second groove, and an orthographic projection of the second groove on the flexible substrate partially overlaps with the second fanout area,
wherein the first groove is on one side of the barrier distal to the display area, and
wherein the bending area further comprises a second edge, the second edge is disposed opposite to the first edge, extending directions of the second edge and the first edge are same, and the second groove is on one side of the second edge proximal to the welding area and extends along a direction substantially parallel to the bending axis.

2. The flexible display panel according to claim 1, wherein the organic insulation layer in the bending area is provided with a third groove and a fourth groove, the third groove and the fourth groove extend along a direction perpendicular to the bending axis.

3. The flexible display panel according to claim 2, wherein each of the third groove and the fourth groove comprises a first end and a second end, the third groove and the fourth groove extend across the bending area, the first end of the third groove and the first end of the fourth groove are respectively connected with two opposite ends of the first groove, and the second end of the third groove and the second end of the fourth groove are respectively connected with two opposite ends of the second groove.

4. The flexible display panel according to claim 3, further comprising:
a signal line, on the flexible substrate, the signal line being led out the display area and at least partially extending to the welding area through the first fanout area and the bending area along the direction perpendicular to the bending axis,
wherein no overlapping area is formed between the orthographic projection of each of the first groove, the second groove, the third groove and the fourth groove on the flexible substrate and an orthographic projection of the signal line on the flexible substrate,
wherein each of the first groove and the second groove is disconnected at a position intersecting with the signal line, the first groove has a first spacing at the intersecting position, the second groove has a second spacing at the intersecting position, and the signal line extends to pass through the first spacing and the second spacing.

5. The flexible display panel according to claim 4, further comprising:
a touch electrode, in the display area and configured to detect occurrence of a touch in the display area,
the signal line comprising:
a touch signal line, configured to be electrically connected with the touch electrode in the display area,
wherein the touch signal line comprises a first touch portion in the bending area and a second touch portion outside the bending area, and the first touch portion of the touch signal line and the second touch portion of the touch signal line are in different film layers.

6. The flexible display panel according to claim 5, wherein the display area comprises a plurality of pixel areas, each of the plurality of the pixel areas is provided with an organic light-emitting element, and the signal line further comprises:
a common signal line, configured to be electrically connected with the organic light-emitting element,
wherein the common signal line comprises a first common portion in the bending area and a second common portion outside the bending area, the first common portion of the common signal line and the second common portion of the common signal line are in different film layers; and
wherein no overlapping area is formed between an orthographic projection of the first common portion of the common signal line on the flexible substrate and an orthographic projection of the first touch portion of the touch signal line on the flexible substrate, and an overlapping area is formed between an orthographic projection of the second common portion of the common signal line on the flexible substrate and an orthographic projection of the second touch portion of the touch signal line on the flexible substrate.

7. The flexible display panel according to claim 6, wherein each of the plurality of the pixel areas is further provided with a pixel circuit, and the signal line further comprises:
a driving signal line, on one side of the common signal line distal to the second fanout area, the driving signal line being configured to be electrically connected with the pixel circuit,
wherein the driving signal line comprises a first driving portion in the bending area and a second driving portion outside the bending area, and the first driving portion of the driving signal line and the second driving portion of the driving signal line are in different film layers.

8. The flexible display panel according to claim 7, further comprising:
a first gate insulation layer, on the flexible substrate;
a first gate electrode layer, on one side of the first gate insulation layer distal to the flexible substrate;
a second gate insulation layer, on one side of the first gate electrode layer distal to the flexible substrate;
a second gate electrode layer, on one side of the second gate insulation layer distal to the flexible substrate,
wherein the first groove is on one side of the second gate electrode layer distal to the flexible substrate.

9. The flexible display panel according to claim 8, wherein the organic insulation layer comprises:
a first planarization layer, on one side of the second gate electrode layer distal to the flexible substrate; and
a second planarization layer, on one side of the first planarization layer distal to the flexible substrate,
wherein the first groove penetrates the first planarization layer and the second planarization layer, the first groove comprises a side wall, and the side wall is a side surface of the second planarization layer encasing the first planarization layer.

10. The flexible display panel according to claim 9, wherein the first groove is formed through a patterning process performed on the second planarization layer by using a dual-tone mask, and an included angle between a tangent line of the side wall and the flexible substrate is approximately from 20 degrees to 40 degrees.

11. The flexible display panel according to claim 9, wherein the side wall has an arc-shaped slope surface, the arc-shaped slope surface is connected with a top surface of the second planarization layer at the peripheral edge of the first groove, and the arc-shaped slope surface is tangent to the top surface at their connection position.

12. The flexible display panel according to 9, wherein the side wall comprises a plurality of side portions in a plane perpendicular to an extending direction of the first groove, each of the plurality of the side portions has an arc-shaped slope surface, and a plurality of the arc-shaped slope surfaces are connected with each other to form the side wall.

13. The flexible display panel according to claim 9, further comprising:
a first source-drain electrically-conductive layer, between the second gate insulation layer and the first planarization layer;
a second source-drain electrically-conductive layer, between the first planarization layer and the second planarization layer;
a first touch electrically-conductive layer, on one side of the second planarization layer distal to the flexible substrate;
a second touch electrically-conductive layer, on one side of the first touch electrically-conductive layer distal to the flexible substrate; and
a touch insulation layer, between the first touch electrically-conductive layer and the second touch electrically-conductive layer,
wherein the first portion of the touch signal line comprises the second source-drain electrically-conductive layer, and the second portion of the touch signal line comprises the first touch electrically-conductive layer and the second touch electrically-conductive layer.

14. The flexible display panel according to claim 13, wherein the second touch electrically-conductive layer in the second touch portion of the touch signal line is in lapped connection with the second source-drain electrically-conductive layer in the first touch portion of the touch signal line through an opening in the second planarization layer,
wherein the first common portion of the common signal line comprises the second source-drain electrically-conductive layer, and the second common portion of the common signal line comprises the first source-drain electrically-conductive layer, and
wherein the first driving portion of the driving signal line comprises the second source-drain electrically-conductive layer, and the second driving portion of the driving signal line comprises the first source-drain electrically-conductive layer.

15. The flexible display panel according to claim 13, further comprising:
an encapsulation layer, between the second planarization layer and the first touch electrically-conductive layer; and
a pixel definition layer, configured to define a plurality of pixel areas, the pixel definition layer being between the second planarization layer and the encapsulation layer,
the barrier comprising:
a first barrier, in the peripheral area and surrounding the display area, wherein the first barrier comprises a first barrier portion in the peripheral transition area and a second barrier portion in other areas of the peripheral area except the peripheral transition area; and
a second barrier, in the peripheral area and surrounding the display area, wherein the second barrier is on one side of the first barrier distal to the display area, and the second barrier comprises a third barrier portion in the peripheral transition area and a fourth barrier portion in other areas of the peripheral area except the peripheral transition area,
wherein the first barrier portion comprises the second planarization layer and the pixel definition layer, and the third barrier portion comprises the first planarization layer, the second planarization layer encasing the first planarization layer, and the pixel definition layer encasing the second planarization layer.

16. The flexible display panel according to claim 15, further comprising:

a spacer layer, between the pixel definition layer and the encapsulation layer,
wherein the second barrier portion comprises the second planarization layer, the pixel definition layer, and the spacer layer, and the fourth barrier portion comprises the first planarization layer, the second planarization layer encasing the first planarization layer, the pixel definition layer encasing the second planarization layer, and the spacer layer.

17. The flexible display panel according to claim 8, wherein
the flexible display panel further comprising:
a data connection line, the data connection line extending from the display area and passing through the first fanout area, the bending area, and the second fanout area to reach the welding area,
wherein a portion of the data connection line respectively in the first fanout area and the second fanout area is formed by the first gate electrode layer and the second gate electrode layer which are alternately arranged.

18. The flexible display panel according to claim 1, further comprising:
a signal line, on the flexible substrate, the signal line being led out the display area and at least partially extending to the welding area through the first fanout area and the bending area along the direction perpendicular to the bending axis,
wherein no overlapping area is formed between the orthographic projection of the first groove on the flexible substrate and an orthographic projection of the signal line on the flexible substrate.

19. A flexible display apparatus, comprising a flexible display panel, the flexible display panel comprising:
a flexible substrate, the flexible substrate comprising:
a display area;
a peripheral area, surrounding a periphery of the display area;
a welding area, on one side of the peripheral area distal to the display area; and
a bending area, between the peripheral area and the welding area, the bending area being configured to be bent along a bending axis, the bending area comprising a first edge;
a barrier, on the flexible substrate, the barrier being in the peripheral area and surrounding the periphery of the display area; and
an organic insulation layer, on the flexible substrate,
wherein the peripheral area comprises a peripheral transition area between the bending area and the display area, the organic insulation layer in the peripheral transition area is provided with a first groove, the first groove is on one side of the barrier distal to the display area and extends along a direction substantially parallel to the bending axis, and the first groove is on one side of the first edge proximal to the display area,
wherein the peripheral transition area comprises a first fanout area, and an orthographic projection of the first groove on the flexible substrate partially overlaps with the first fanout area,
wherein the flexible substrate further comprises:
a second fanout area, between the bending area and the welding area, the second fanout area abutting on the bending area,
wherein the organic insulation layer between the bending area and the welding area is provided with a second groove, and an orthographic projection of the second groove on the flexible substrate partially overlaps with the second fanout area,
wherein the first groove is on one side of the barrier distal to the display area, and
wherein the bending area further comprises a second edge, the second edge is disposed opposite to the first edge, extending directions of the second edge and the first edge are same, and the second groove is on one side of the second edge proximal to the welding area and extends along a direction substantially parallel to the bending axis.

20. A method for manufacturing a flexible display panel, comprising:
providing a flexible substrate, the flexible substrate comprising:
a display area;
a peripheral area, surrounding a periphery of the display area;
a welding area, on one side of the peripheral area distal to the display area; and
a bending area, between the peripheral area and the welding area, the bending area being configured to be bent along a bending axis, the bending area comprising a first edge, wherein the peripheral area comprises a peripheral transition area between the bending area and the welding area;
forming a barrier on the flexible substrate, the barrier being in the peripheral area and surrounding the periphery of the display area;
forming an organic insulation layer on the flexible substrate; and
forming a first groove in the organic insulation layer in the peripheral transition area, the first groove being on one side of the barrier distal to the display area and extending along a direction parallel to the bending axis, and the first groove being on one side of the first edge proximal to the display area,
wherein the first groove is formed through a patterning process performed on the organic insulation layer by using a dual-tone mask.

21. The method according to claim 20, wherein the forming the organic insulation layer on the flexible substrate comprises:
forming a first planarization thin film on the flexible substrate;
patterning the first planarization thin film to form a first planarization layer;
forming a second planarization thin film on one side of the first planarization layer distal to the flexible substrate, the second planarization thin film overlaying the first planarization layer; and
patterning the second planarization thin film by using the dual-tone mask to form a second planarization layer having the first groove,
wherein the first groove is formed through the patterning process performed on the second planarization thin film in the peripheral area by using the dual-tone mask, and the first groove penetrates the first planarization layer and the second planarization layer.

* * * * *